(12) United States Patent
Han et al.

(10) Patent No.: US 10,922,828 B2
(45) Date of Patent: Feb. 16, 2021

(54) META PROJECTOR AND ELECTRONIC APPARATUS INCLUDING THE SAME

(71) Applicant: SAMSUNG ELECTRONICS CO., LTD., Suwon-si (KR)

(72) Inventors: Seunghoon Han, Seoul (KR); Byunghoon Na, Suwon-si (KR); Jangwoo You, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/166,334

(22) Filed: Oct. 22, 2018

(65) Prior Publication Data

US 2019/0057512 A1 Feb. 21, 2019

Related U.S. Application Data

(63) Continuation-in-part of application No. 15/991,005, filed on May 29, 2018.

(30) Foreign Application Priority Data

Jul. 31, 2017 (KR) .......................... 10-2017-0097134

(51) Int. Cl.
*G06T 7/521* (2017.01)
*G06T 7/73* (2017.01)
(Continued)

(52) U.S. Cl.
CPC .......... *G06T 7/521* (2017.01); *G01B 11/2513* (2013.01); *G02B 1/118* (2013.01);
(Continued)

(58) Field of Classification Search
CPC ...... G02B 1/118; G02B 5/1809; G02B 1/002; G02B 27/0944; G02B 27/20;
(Continued)

(56) References Cited

U.S. PATENT DOCUMENTS 6,937,405 B2   8/2005   Sugawara
9,417,442 B1   8/2016   Laine et al.
(Continued)

FOREIGN PATENT DOCUMENTS

CN   101819501 A   9/2010
CN   105068363   * 11/2015
(Continued)

OTHER PUBLICATIONS

Communication dated Dec. 14, 2018 issued by the European Patent Office in counterpart European Patent Application No. 18176506.6.

*Primary Examiner* — Kenneth Bukowski
(74) *Attorney, Agent, or Firm* — Sughrue Mion, PLLC

(57) ABSTRACT

A meta projector is provided, including an edge emitting device configured to emit light through a side surface thereof, a meta-structure layer spaced apart from the upper surface of the edge emitting device that includes a plurality of nanostructures having a sub-wavelength dimension smaller than a wavelength of the light emitted from the edge emitting device, and a path changing member configured to change a path of the light emitted from the edge emitting device so as to direct the path toward the meta-structure layer. The meta projector may thus be configured to emit a light pattern of structured light, based on directing the light emitted from the edge emitting device through the meta-structure layer.

17 Claims, 21 Drawing Sheets

(51) Int. Cl.
  *G06T 7/55* (2017.01)
  *G06T 7/514* (2017.01)
  *H04N 5/247* (2006.01)
  *H01S 5/022* (2021.01)
  *G06F 1/16* (2006.01)
  *H04N 13/239* (2018.01)
  *H04N 13/254* (2018.01)
  *H04N 13/128* (2018.01)
  *H04N 13/122* (2018.01)
  *G02B 1/118* (2015.01)
  *G01B 11/25* (2006.01)
  *G02B 5/18* (2006.01)
  *H01S 5/00* (2006.01)
  *H01S 5/02216* (2021.01)
  *H04N 13/00* (2018.01)

(52) U.S. Cl.
  CPC ......... *G02B 5/1809* (2013.01); *G06F 1/1639* (2013.01); *G06F 1/1673* (2013.01); *G06T 7/514* (2017.01); *G06T 7/55* (2017.01); *G06T 7/74* (2017.01); *H01S 5/02296* (2013.01); *H04N 5/247* (2013.01); *H04N 13/122* (2018.05); *H04N 13/128* (2018.05); *H04N 13/239* (2018.05); *H04N 13/254* (2018.05); *G06T 2207/10028* (2013.01); *G06T 2207/10048* (2013.01); *G06T 2207/20224* (2013.01); *H01S 5/0071* (2013.01); *H01S 5/02216* (2013.01); *H01S 5/02276* (2013.01); *H01S 5/02288* (2013.01); *H04N 2013/0081* (2013.01)

(58) Field of Classification Search
  CPC ...... G02B 5/1871; G01B 11/22; G01B 11/25; G01B 11/2513; G01B 9/08; G03B 21/00; G03B 21/001; G03B 21/2033; G03B 21/2066; G06F 1/1639; G06F 1/1673; G06F 3/0304; G06F 3/0426; G06F 3/04886; G06T 2207/10028; G06T 2207/10048; G06T 2207/20224; G06T 7/514; G06T 7/521; G06T 7/55; G06T 7/74; H01S 5/0071; H01S 5/02216; H01S 5/02276; H01S 5/02288; H01S 5/02296; H01S 5/026; H01S 5/12; H01S 5/3013; H01S 5/343; H04N 13/122; H04N 13/128; H04N 13/239; H04N 13/254; H04N 2013/0081; H04N 5/247
  See application file for complete search history.

(56) References Cited

U.S. PATENT DOCUMENTS

| | | | | |
|---|---|---|---|---|
| 2008/0106620 | A1* | 5/2008 | Sawachi | H04N 13/239 348/262 |
| 2008/0291951 | A1* | 11/2008 | Konttinen | G02B 5/1809 372/21 |
| 2011/0074927 | A1* | 3/2011 | Perng | H04N 13/239 348/46 |
| 2014/0211215 | A1 | 7/2014 | Pesach et al. | |
| 2015/0277137 | A1 | 10/2015 | Aschwanden et al. | |
| 2015/0292709 | A1 | 10/2015 | Petronius et al. | |
| 2015/0341619 | A1* | 11/2015 | Meir | H04N 13/257 348/47 |
| 2016/0124295 | A1 | 5/2016 | Montgomery | |
| 2016/0127714 | A1* | 5/2016 | Hazeghi | G02B 27/0075 348/46 |
| 2016/0259175 | A1* | 9/2016 | Ellenbogen | G02B 5/30 |
| 2019/0025408 | A1 | 1/2019 | Hwang et al. | |
| 2019/0154877 | A1* | 5/2019 | Capasso | G02B 3/02 |

FOREIGN PATENT DOCUMENTS

| | | |
|---|---|---|
| CN | 106842606 A | 6/2017 |
| CN | 106990660 A | 7/2017 |
| EP | 1 777 490 A2 | 4/2007 |
| EP | 2 918 968 A2 | 9/2015 |
| JP | 8-17721 A | 1/1996 |
| JP | 3784255 B2 | 6/2006 |
| KR | 10-2013-0105381 A | 9/2013 |
| KR | 2017-0016175 A | 2/2017 |
| WO | 2008/142210 A1 | 11/2008 |

\* cited by examiner

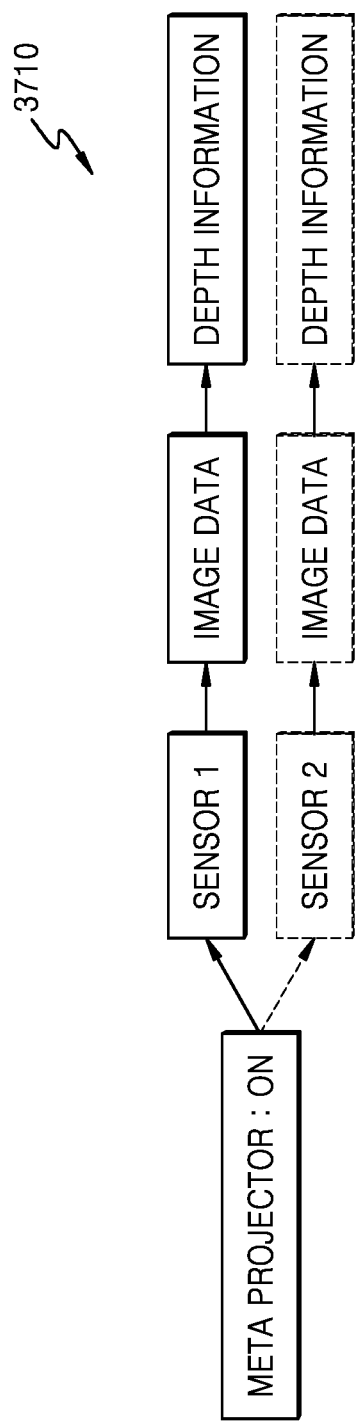
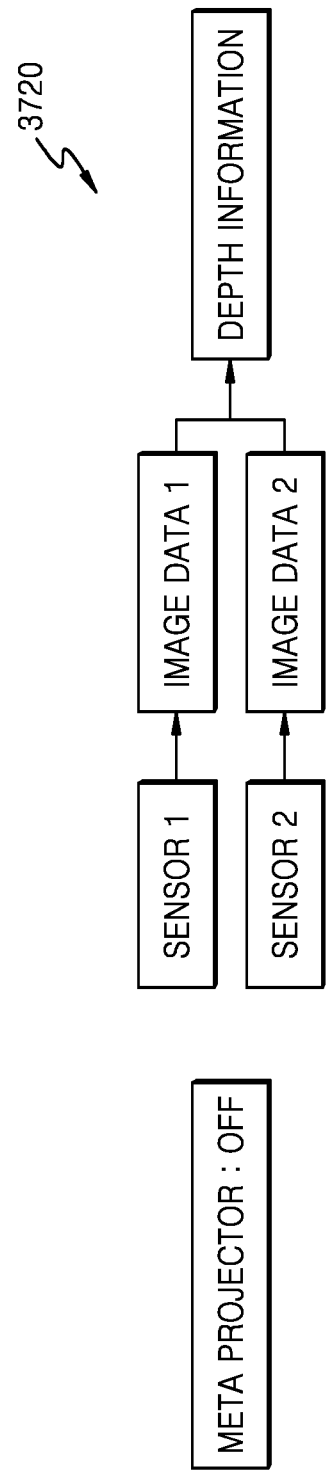

META PROJECTOR AND ELECTRONIC APPARATUS INCLUDING THE SAME

CROSS-REFERENCE TO RELATED APPLICATION

This is a Continuation-In-Part Application of U.S. application Ser. No. 15/991,005 filed on May 29, 2018, which claims priority under 35 U.S.C. § 119, of Korean Patent Application No. 10-2017-0097134, filed on Jul. 31, 2017, in the Korean Intellectual Property Office, the disclosures of which are incorporated herein in their entirety by reference.

BACKGROUND

1. Field

Example embodiments relate to a meta projector and an electronic apparatus including the meta projector.

2. Description of the Related Art

Recently, demand has gradually increased for small laser projectors for combination with any of various electronic apparatuses.

For example, ultra-small projectors may be used for augmented reality (AR), virtual reality (VR), and mixed reality (MR) implemented by mobile and wearable devices, and laser projectors may be used to form structured light in depth sensors used to accurately recognize three-dimensional shapes of objects such as humans or other things.

In general, lighting components for laser projection are fabricated using micro-optic technology, and a plurality of optical components are necessary to achieve desired performance. The volume occupied by such optical components is a factor affecting design precision and fabrication conditions.

SUMMARY

One or more example embodiments may provide meta projectors having ultra-small size and configured to output light with desired performance (e.g., structured light having a particular pattern).

One or more example embodiments may provide electronic apparatuses including one or more meta projectors.

Additional example aspects and advantages will be set forth in part in the description which follows and, in part, will be apparent from the description, or may be learned by practice of the presented example embodiments.

According to an aspect of an example embodiment, a meta projector may include a substrate, an edge emitting device on the substrate, a meta-structure layer spaced apart from the upper surface of the edge emitting device, and a path changing member. The edge emitting device may include an upper surface extending parallel to the substrate and a side surface inclined relative to the upper surface, the edge emitting device configured to emit light through the side surface. The meta-structure layer may be spaced apart from the upper surface of the edge emitting device. The meta-structure layer may include a plurality of nanostructures having a sub-wavelength dimension, the sub-wavelength dimension being smaller than a wavelength of the light emitted from the edge emitting device. The path changing member may be configured to change a path of the light emitted from the edge emitting device to direct the path toward the meta-structure layer.

The meta projector may further include a housing fixing the substrate, the meta-structure layer, and the path changing member, such that the meta projector is an integrated module.

The substrate may include a cathode and an anode respectively connected to two electrodes of the edge emitting device; and an insulating layer electrically isolating the cathode and the anode from each other.

The plurality of nanostructures may include a material having a refractive index higher than a refractive index of a separate material adjacent to the plurality of nanostructures.

The plurality of nanostructures may include a conductive material.

The plurality of nanostructures may be arranged in a shape distribution that is a regular distribution or a random distribution, such that the plurality of nanostructures are configured to form structured light having a particular pattern based on receiving the light emitted from the edge emitting device.

The shape distribution of the plurality of nanostructures may be configured to deflect and output the structured light in a particular direction.

A shape distribution of the plurality of nanostructures may be arranged such that they provide a different transmission phase distribution based on polarization of incident light.

Shapes of cross-sections of the plurality of nanostructures parallel to the upper surface of the edge emitting device may have asymmetry.

The plurality of nanostructures may be arranged with an arrangement pitch which is equal to or less than one-half of the wavelength of the light emitted from the edge emitting device.

The meta-structure layer may further include a support layer supporting the plurality of nanostructures, and the plurality of nanostructures may include a first plurality of nanostructures on a first side of the support layer and a second plurality of nanostructures on a second, opposite, side of the support layer.

The first plurality of nanostructures on the first, light-incident side of the support layer may be arranged with a shape distribution configured to provide a transmission phase distribution that increases a divergence angle of incident light.

The path changing member may include a reflective surface configured to bend the path of the light emitted from the edge emitting device by a particular angle.

The reflective surface may include a curved surface configured to adjust a divergence angle of incident light.

The reflective surface may include a meta-surface, the meta-surface including a plurality of nanostructures, the plurality of nanostructures arranged with a sub-wavelength dimension smaller than the wavelength of the light emitted from the edge emitting device.

A shape distribution of the plurality of nanostructures of the meta-surface may be configured to adjust a divergence angle of incident light.

A shape distribution of the plurality of nanostructures of the meta-structure layer may be arranged with forming structured light providing a keyboard image in which a set of character keys is arranged or an image including at least one icon.

A user interface device may include the meta projector and an imaging device configured to photograph an image formed by the meta projector.

An electronic apparatus may include the user interface device, a memory configured to store at least one program of instructions, and a processor configured to extract a user input signal from an image captured by the imaging device and execute the program of instructions according to the user input signal.

A depth recognition apparatus may include the meta projector configured to emit structured light toward an object, a sensor configured to receive the structured light reflected from the object, and a calculator configured to compare a pattern of the structured light emitted toward the object and a pattern of the structured light reflected from the object, and calculate a depth position of the object.

According to an aspect of an example embodiment, a meta projector may include a substrate, an edge emitting device on the substrate, and a path changing member configured to change a path of the light emitted from the edge emitting device. The edge emitting device may include an upper surface extending parallel to the substrate and a side surface inclined relative to the upper surface, the edge emitting device configured to emit light through the side surface. The path changing member may include a reflective surface configured to bend the path of the light emitted from the edge emitting device by a particular angle, the reflective surface including a meta-surface, the meta-surface including a plurality of nanostructures, the plurality of nanostructures arranged with a sub-wavelength dimension smaller than a wavelength of the light emitted from the edge emitting device.

The reflective surface may include a curved surface configured to adjust a divergence angle of incident light.

A shape distribution of the plurality of nanostructures of the meta-surface may be configured to a divergence angle of incident light.

A shape distribution of the plurality of nanostructures of the meta-surface may be configured to form structured light providing a keyboard image in which a set of character keys is arranged or an image including at least one icon.

The substrate may include a cathode and an anode respectively connected to two electrodes of the edge emitting device; and an insulating layer electrically isolating the cathode and the anode from each other.

The plurality of nanostructures may include a material having a refractive index higher than a refractive index of a different material adjacent to the plurality of nanostructures.

The plurality of nanostructures may include a conductive material.

According to an aspect of an example embodiment, a meta projector may include a substrate, an edge emitting device on the substrate, and a plurality of nanostructures. The edge emitting device may include an upper surface extending parallel to the substrate and a side surface inclined relative to the upper surface, the edge emitting device configured to emit light through the side surface. The plurality of nanostructures may be configured to receive the light emitted from the edge emitting device and generate a structured light pattern based on receiving the light emitted from the edge emitting device, the plurality of nanostructures having a sub-wavelength dimension, the sub-wavelength dimension smaller than a wavelength of the light emitted from the edge emitting device.

The plurality of nanostructures may be included in a meta-structure layer spaced apart from the upper surface of the edge emitting device. The meta projector may further include a path changing member configured to change a path of the light emitted from the edge emitting device to direct the path toward the meta-structure layer.

The plurality of nanostructures may be included in a path changing member of the meta projector, the path changing member configured to change a path of the light emitted from the edge emitting device. The path changing member may include a reflective surface configured to bend the path of the light emitted from the edge emitting device by a particular angle. The reflective surface may include a meta-surface, the meta-surface including the plurality of nanostructures.

The reflective surface may include a curved surface configured to adjust a divergence angle of incident light.

A shape distribution of the plurality of nanostructures of the meta-surface may be configured to adjust a divergence angle of incident light.

A shape distribution of the plurality of nanostructures of the meta-surface may be configured to form structured light providing a keyboard image in which a set of character keys is arranged or an image including at least one icon.

The substrate may include a cathode and an anode respectively connected to two electrodes of the edge emitting device; and an insulating layer electrically isolating the cathode and the anode from each other.

The plurality of nanostructures may include a material having a refractive index higher than a refractive index of a different material adjacent to the plurality of nanostructures.

The plurality of nanostructures may include a conductive material.

According to an aspect of an example embodiment, a depth recognition apparatus may include: any one of the above-described meta projectors configured to emit structured light to an object; a first sensor and a second sensor that are configured to receive light coming from the object and arranged at different positions relative to the meta projector; and a processor configured to analyze the light received by at least one of the first and second sensors to calculate a depth position of the object.

The processor may be configured to: obtain first image data from the light received at the first sensor; obtain second image data from the light received at the second sensor; and calculate the depth position of the object based on the first image data and the second image data.

The processor may be configured to: obtain first depth information about the object by analyzing the structured light emitted from the meta projector to the object and the light received at the first sensor; obtain second depth information about the object by analyzing the structured light emitted from the meta projector to the object and the light received at the second sensor; and calculate the depth position of the object based on the first depth information and the second depth information.

The depth recognition apparatus may further include an illuminance sensor configured to sense illuminance of a surrounding area, wherein when a signal sensed by the illuminance sensor is equal to or greater than a given value, the processor may turn off the meta project.

When the meta projector is in an off-state, the processor may be configured to: obtain first image data about the object from a signal that the first sensor outputs when receiving ambient light reflected from the object; obtain second image data about the object from a signal that the second sensor outputs when receiving ambient light reflected from the object; and calculate the depth position of the object based on the first image data and the second image data.

The processor may be configured to: turn on the meta projector and obtain primary-first image data and secondary-first image data from light received at the first and second sensors, respectively; and turn off the meta projector and obtain primary-second image data and secondary-second image data from light received at the first and second sensors, respectively.

The processor may be configured to: calculate first depth information about the object from the primary-first image data and the secondary-first image data; calculate second depth information about the object from the primary-second image data and the secondary-second image data; and calculate the depth position of the object based on the first depth information and the second depth information.

The processor may be configured to: calculate first difference image data from a difference between the primary-first image data and the primary-second image data; calculate second difference image data from a difference between the secondary-first image data and the secondary-second image data; and calculate the depth position of the object based on the first image data and the second image data.

At least one of the first and second sensors may include: a switchable filter configured to be switched between an infrared-cut mode and an infrared transmission mode; and an image sensor configured to sense light incident thereon after being transmitted through the switchable filter.

The processor may be configured to control the switchable filter such that the switchable filter may block infrared rays in a normal photographic mode and may transmit infrared rays in a depth recognition mode.

BRIEF DESCRIPTION OF THE DRAWINGS

These and/or other example aspects and advantages will become apparent and more readily appreciated from the following description of the example embodiments, taken in conjunction with the accompanying drawings in which:

FIGS. 19 to 24 are block diagrams illustrating operations and processing in the example execution modes shown in FIG. 18.

DETAILED DESCRIPTION

Figure 1:
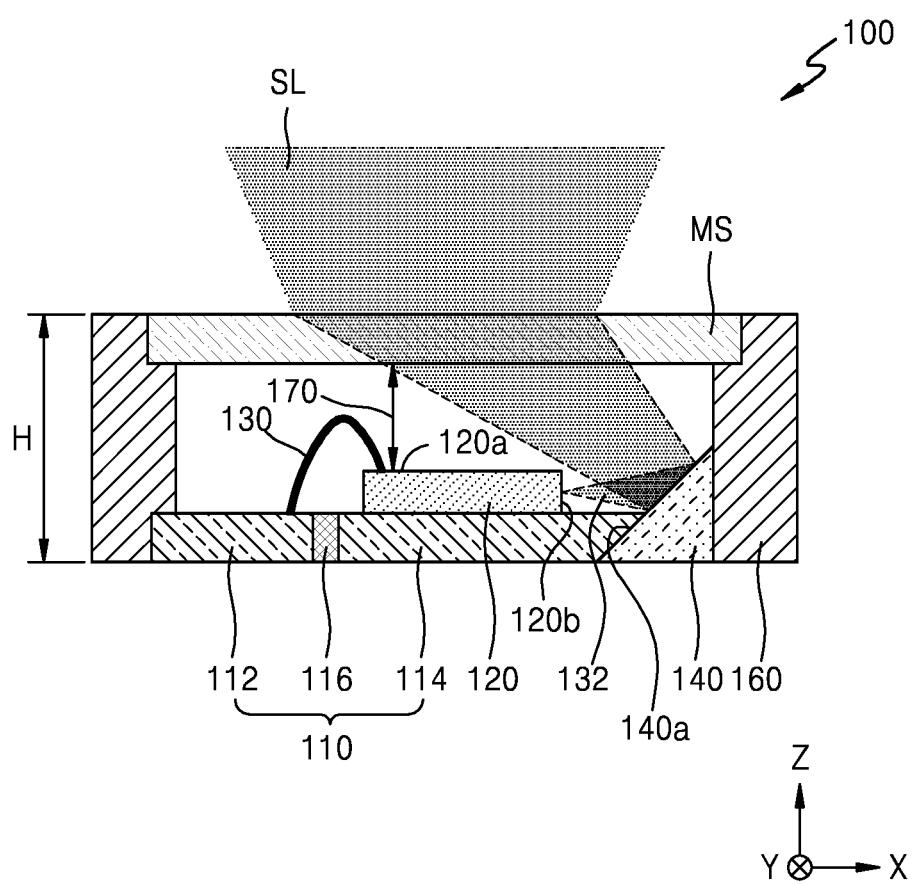
FIG. 1 is a cross-sectional view illustrating a schematic configuration of a meta projector according to an example embodiment.

Reference will now be made in detail to example embodiments, at least some of which are illustrated in the accompanying drawings, wherein like reference numerals refer to like elements throughout. In this regard, some example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments of the present disclosure will be described with reference to the accompanying drawings. In the drawings, like reference numbers refer to like elements, and the sizes of elements may be exaggerated for clarity of illustration. The example embodiments described herein are for illustrative purposes only, and various modifications may be made therefrom.

In the following description, when an element is referred to as being "above" or "on" another element, it may be directly on the other element while making contact with the other element or may be above the other element without making contact with the other element. Furthermore, when an element is referred to as being "on" another element, it will be understood that the element may be above or below the other element.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As used herein, the singular forms "a," "an", and "the" are intended to include the plural forms as well, unless the context clearly indicates otherwise. It will be further understood that the terms "comprises" and/or "comprising" used herein specify the presence of stated features or elements, but do not preclude the presence or addition of one or more other features or elements.

In the present disclosure, terms such as unit or module are used to denote a unit having at least one function or operation and implemented with hardware, software, or a combination of hardware and software. Terms such as "unit"

or "module" may further be used to denote an instance of hardware that is configured to perform the at least one function or operation.

Figure 2:
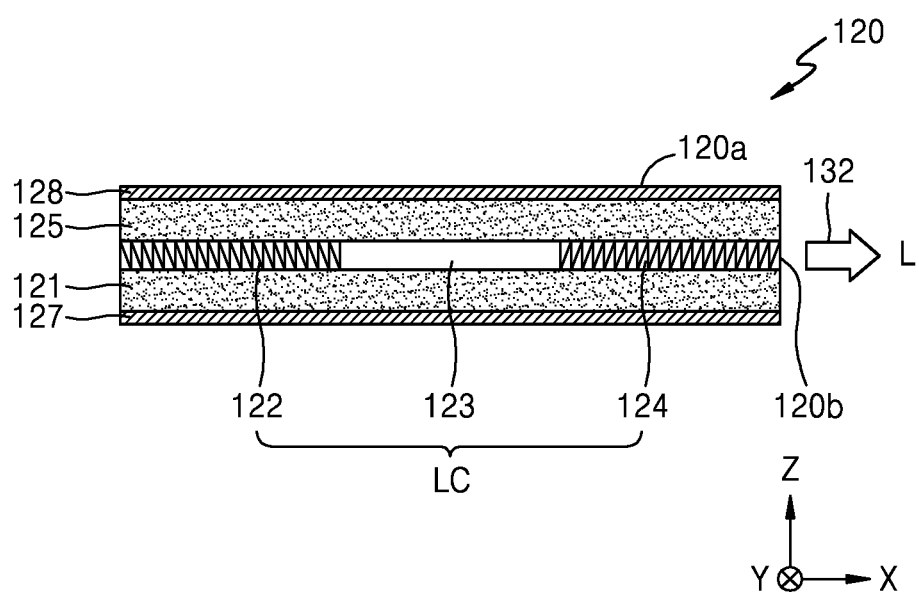
FIG. 2 is a cross-sectional view illustrating an example configuration of an edge emitting device included in the meta projector of FIG. 1.
Figure 3:
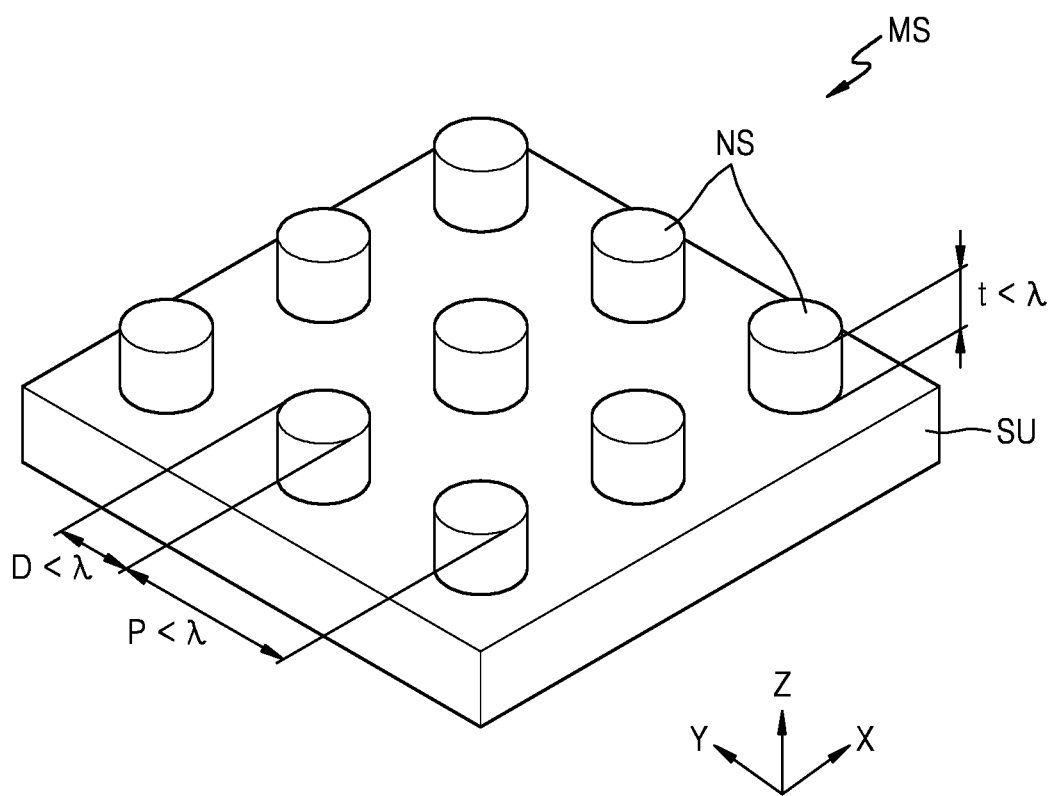
FIG. 3 is a perspective view illustrating an example configuration of a meta-structure layer that may be employed in the meta projector of FIG. 1.

FIG. 1 is a cross-sectional view illustrating a schematic configuration of a meta projector 100 according to an example embodiment. FIG. 2 is a cross-sectional view illustrating an example configuration of an edge emitting device 120 included in the meta projector 100 of FIG. 1. FIG. 3 is a perspective view illustrating an example configuration of a meta-structure layer MS that may be employed ("included") in the meta projector 100 of FIG. 1.

The meta projector 100 includes: the edge emitting device 120; the meta-structure layer MS spaced apart from the edge emitting device 120 and configured to convert light 132 emitted from the edge emitting device 120 into structured light SL having a predetermined pattern and output the structured light SL; and a path changing member 140 configured to change a path of the light 132 emitted from the edge emitting device 120 to direct the light toward the meta-structure layer MS.

When light 132 generated by the edge emitting device 120 is incident on the meta-structure layer MS, the meta-structure layer MS forms a distribution of light rays propagating in space based on the incident light 132. Such light rays form one or more beam spots and are variously distributed according to conditions applied to the meta-structure layer MS. These light lays are called structured light SL.

The structured light SL generated by the meta-structure layer MS may have a pattern mathematically coded to uniquely designate angular position coordinates using bright and dark points. Such a pattern may change shape as it is incident on a three-dimensional object, and this change may be imaged using an imaging device such as a camera so as to extract depth information about the three-dimensional object by comparing patterns and tracing the degree of variation in pattern shape according to coordinates.

The edge emitting device 120 may be placed ("located") on a substrate 110 and may include an upper surface 120a extending in parallel with the substrate 110 and a side surface 120b inclined relative to the upper surface 120a (e.g., side surface 120b may extend orthogonally relative to the upper surface 120a, as shown in FIG. 1). The side surface 120b is a light exit surface.

As shown in FIG. 1, the meta-structure MS is spaced apart from the upper surface 120a of the edge emitting device 120 according to spacing distance 170. As shown in FIG. 1, the meta structure MS may extend in parallel to or substantially in parallel to (e.g., parallel within manufacturing tolerances and/or material tolerances) the upper surface 120a of the edge emitting device 120. Since the meta-structure layer MS is placed above the edge emitting device 120, and light 132 exits the edge emitting device 120 through the side surface 120b, a path changing member 140 is further provided between the edge emitting device 120 and the meta-structure layer MS, where the path changing member 140 is configured to change the path of light 132 exiting the edge emitting device 120 such that the path may be directed toward the meta-structure layer MS, as shown in FIG. 1. The path changing member 140 may include a reflective surface 140a which is configured to bend the propagation path of light 132 exiting the edge emitting device 120 by a predetermined angle. For example, in the example embodiments shown in FIG. 1, the reflective surface 140a may be configured to bend the propagation path of light 132 by approximately 120 degrees. The reflective surface 140a may be mirror-coated. The inclination angle of the reflective surface 140a is associated with the position of the meta-structure layer MS relative to the side surface 120b which is a light exit surface of the edge emitting device 120, so that the reflective surface 140a is configured to bend the optical axis of light by a predetermined angle. For example, the optical axis of light may be bent in a vertical direction or may be bent such that light may propagate in a direction inclined leftward by about 30°.

An example configuration of the edge emitting device 120 will now be described with reference to FIG. 2.

The edge emitting device 120 includes a lower clad layer 121 and an upper clad layer 125 spaced apart from each other. A gain region 123 is provided between the lower clad layer 121 and the upper clad layer 125. A first mirror region 122 and a second mirror region 124 are placed ("located") on both sides ("opposite sides") of the gain region 123. The first mirror region 122, the gain region 123, and the second mirror region 124 form ("at least partially comprise") a laser cavity LC.

The gain region 123 may include a material configured to generate light in a predetermined wavelength band ("wavelength spectrum of light") when electrons and holes are injected through a first electrode 127 and a second electrode 128. The gain region 123 may include a group III-V compound semiconductor, or a quantum well or dot structure based on a group III-V compound semiconductor.

The lower clad layer 121 and the upper clad layer 125 may include a semiconductor material having a larger band gap than that of the gain region 123. For example, the lower clad layer 121 and the upper clad layer 125 may include GaAs, GaP, AlGaAs, InGaP, or InGaAlP.

The first electrode 127 may be provided on a lower surface of the lower clad layer 121, and the second electrode 128 may be provided on an upper surface of the upper clad layer 125, so as to inject current into the gain region 123. A contact layer (not shown) may be further provided between the lower clad layer 121 and the first electrode 127, and another contact layer (not shown) may be provided between the upper clad layer 125 and the second electrode 128. The contact layers may include GaAs, GaP, AlGaAs, InGaP, or InGaAs. The contact layers may be doped with an impurity to facilitate current injection into the gain region 123.

The first mirror region 122, the gain region 123, and the second mirror region 124 are arranged along in a horizontal direction, that is, in an X-axis direction as shown in FIG. 2. The first mirror region 122 and the second mirror region 124 reflect light generated in the gain region 123, and amplify light satisfying a predetermined resonance condition and allow the amplified light to exit the edge emitting device 120 as light 132.

The first mirror region 122 and the second mirror region 124 may have a grating pattern configured to reflect light. The grating pattern has a horizontal repetition direction (the X-axis direction). Reflectivity may be adjusted according to the shape or repetition period of the grating pattern. In addition, the first mirror region 122 and the second mirror region 124 may be adjusted to have different reflectivities so as to control the direction in which light exits. For example, the first mirror region 122 may have a reflectivity of about 90% or greater, and the second mirror region 124 may have lower reflectivity than the first mirror region 122. In this case, light may exit to the side surface 120b through the second mirror region 124. However, this is a non-limiting example. In addition to the grating pattern, the first and second mirror regions 122 and 124 may employ ("include") any of various structures configured to perform a reflection function to form a resonator together with the gain region 123.

The edge emitting device 120 may further include: a semiconductor optical amplifier configured to further amplify light amplified while resonating in the laser cavity LC and exiting the edge emitting device 120; and a waveguide structure to guide light to a desired position.

In the above description, the basic configuration of the edge emitting device 120 is described, but the edge emitting device 120 is not limited thereto. The edge emitting device 120 may include a Fabry-Perot laser diode or a distributed feedback (DFB) laser diode. In addition, any structure having a lateral light exit surface may be employed.

The substrate 110 includes: a cathode 114 and an anode 112 respectively connected to the two electrodes 127 and 128 of the edge emitting device 120; and an insulating layer 116 electrically separating ("isolating," "insulating," etc.) the cathode 114 and the anode 112 from each other. The cathode 114 may be directly or indirectly in contact with the first electrode 127 provided on a lower surface of the edge emitting device 120, and the anode 112 may be connected through a wire 130 to the second electrode 128 provided on an upper surface of the edge emitting device 120.

The substrate 110 may also be configured to function as a heat sink discharging heat generated by the edge emitting device 120. That is, heat from the edge emitting device 120 may be discharged to the outside through the cathode 114 including a metallic material.

The meta projector 100 may be provided as an integrated module. That is, the substrate 110, the meta-structure layer MS, and the path changing member 140 may be provided as an integrated module. The meta projector 100 may further include a housing 160 configured to hold the substrate 110, the meta-structure layer MS, and the path changing member 140. In other words, the housing 160 may fix the substrate 110, the meta-structure layer MS, and the path changing member 140, such that the meta projector 100 is an integrated module. An "integrated module" will be understood to refer to a device that is an assembly of elements that are permanently coupled ("fixed") to each other, such that an interior of the assembly is sealed or substantially sealed (e.g., sealed within manufacturing tolerances and/or material tolerances) from external mechanical manipulation and the assembly may be referred to as a single, individual element.

The meta-structure layer MS includes a plurality of nanostructures NS having a sub-wavelength dimension that is smaller than the wavelength of light exiting the edge emitting device 120.

Referring to FIG. 3, a configuration of the meta-structure layer MS will be described.

The plurality of nanostructures NS included in the meta-structure layer MS have at least one sub-wavelength dimension that is smaller than the wavelength A of light 132 emitted from the edge emitting device 120. Here, the term "sub-wavelength dimension" means a numerical value of a dimension, such as a thickness or a cross-sectional width defining the shape of the nanostructures NS, which is smaller than the wavelength A of light 132 emitted from the edge emitting device 120.

According to an aspect of an example embodiment, the thicknesses (t) of the nanostructures NS may be smaller than the wavelength A of light 132 emitted from the edge emitting device 120, and/or the arrangement pitch P of the nanostructures NS may be smaller than the wavelength A.

In some example embodiments, the dimension and/or the arrangement pitch P of the nanostructures NS may be equal to or less than one-half of the wavelength A of light emitted from the edge emitting device 120. The nanostructures NS may be configured to operate as a strong scattering unit forming a meta-structure. As the arrangement pitch P becomes smaller than the wavelength A, incident light 132 on the nanostructures NS may be controlled to have a desired shape without high order diffraction, based on the at least one sub-wavelength dimension of the plurality of nanostructures NS.

Although the nanostructures NS are illustrated as having a cylindrical shape, the nanostructures NS are not limited thereto. Cross-sections of the nanostructures NS perpendicular to the thickness "t" direction of the nanostructures NS, that is, parallel with an XY plane, may have any of various shapes such as a polygonal shape, a cross shape, a star shape, or an asymmetric shape. In addition, although the nanostructures NS are illustrated as all having the same shape ("a common shape"), the nanostructures NS are not limited thereto. For example, nanostructures NS having any of various shapes may be provided on the meta-structure layer MS, such that one or more of the nanostructures NS may have a shape different from one or more other of the nanostructures NS.

The meta-structure layer MS may further include a support layer SU that supports the plurality of nanostructures NS. The support layer SU may include a dielectric material. For example, the support layer SU may include a polymer material such as polycarbonate (PC), polystyrene (PS), or polymethylmethacrylate (PMMA), or $SiO_2$.

The nanostructures NS may include a dielectric material. The nanostructures NS may include a material having a refractive index greater than the refractive index of a separate material that is adjacent to the plurality of nanostructures NS (e.g., a support layer SU). The nanostructures NS may include a material having a refractive index greater than the refractive index of the support layer SU. For example, the nanostructures NS may include any one of single crystal silicon, polycrystalline silicon (poly Si), amorphous silicon, $Si_3N_4$, GaP, $TiO_2$, AlSb, AlAs, AlGaAs, AlGaInP, BP, and $ZnGeP_2$.

In some example embodiments, the plurality of nanostructures NS may include a conductive material. The conductive material may be a highly conductive metallic material configured to induce surface plasmon excitation. For example, the plurality of nanostructures NS may include at least any one selected from copper (Cu), aluminum (Al), nickel (Ni), iron (Fe), cobalt (Co), zinc (Zn), titanium (Ti), ruthenium (Ru), rhodium (Rh), palladium (Pd), platinum (Pt), silver (Ag), osmium (Os), iridium (Ir), gold (Au), and an alloy including any one of the listed elements. In addition, the nanostructures NS may include a highly conductive two-dimensional material such as graphene, or a conductive oxide.

In some example embodiments, some of the nanostructures NS may include a dielectric material having a high refractive index, and some of the nanostructures NS may include a conductive material. That is, some of the nanostructures NS may include a dielectric material having ("associated with") a refractive index greater than the refractive index of the substrate 110, and the other of the nanostructures NS may include a conductive material.

Each of the above-described nanostructures NS may be associated with a unique transmission intensity and transmission phase depending on the material and shape thereof. The phase or intensity distribution of light transmitted through the meta-structure layer MS may be controlled by adjusting the shape distribution of the nanostructures NS. Herein, the term "shape distribution" refers to at least any one of the shape of the plurality of nanostructures NS, the size of the plurality of nanostructures NS, the size distribution of the plurality of nanostructures NS, the arrangement pitch of the plurality of nanostructures NS, and the arrangement pitch distribution of the plurality of nanostructures NS. In some example embodiments, the plurality of nanostructures NS are associated with a particular shape distribution that is a regular distribution or a random distribution, such that the plurality of nanostructures are configured to form structured light SL having a particular pattern based on receiving the light 132 emitted from the edge emitting device 120. The shape distribution of the plurality of nanostructures NS may be associated with deflecting and outputting the structured light SL in a particular direction. In some example embodiments, a shape distribution of the plurality of nanostructures is associated with different transmission phase distributions based on the polarization of incident light.

Although it is illustrated that all the nanostructures NS have the same shape, size and height, this is an example. That is, the nanostructures NS are not limited thereto. For example, the horizontal or vertical size or material of the nanostructures NS may be determined according to the positions of the nanostructures NS so as to cause the plurality of nanostructures NS to generate structured light SL having a particular transmission intensity distribution or a particular transmission phase distribution based on light 132 incident on the meta-structure layer MS, such that the plurality of nanostructures NS may be referred to as being "associated with" the particular transmission intensity distribution or the particular transmission phase distribution. In order to cause the plurality of nanostructures NS to generate structured light SL having a particular transmission intensity distribution or transmission phase distribution, the shape distribution of a group of a plurality of nanostructures NS may be determined according to the positions of the nanostructures NS. In addition, such groups of nanostructures NS may be repeatedly arranged at a predetermined period. The shape distribution of the plurality of nanostructures NS may be regular, periodic, or pseudo-periodic. However, the shape distribution of the plurality of nanostructures NS is not limited thereto. For example, the shape distribution of the plurality of nanostructures NS may be random.

The meta-structure layer MS may have an ultra-small pitch and a small thickness as compared with micro-optical components of the related art, and thus may form an arbitrary pattern over a wide angular range without high order diffraction. Therefore, the meta projector 100 may have an ultra-small size (e.g., a relatively small size). For example, the thickness H of the meta projector 100 may be about 4 mm or less.

In other words, based on the use of a plurality of nanostructures NS as described herein, wherein the plurality of nanostructures NS have one or more physical distributions (e.g., shape distribution) as described herein such that the plurality of nanostructures NS are configured to generate structured light SL having a particular pattern based on light 132 emitted from the edge emitting device 120 being incident on the plurality of nanostructures NS, a meta projector may be configured to generate structured light SL having the particular pattern while retaining a relatively small ("compact") size. As a result, the meta projector may provide improved capital costs of manufacture for the meta projector and one or more devices that may incorporate the meta projector. The meta projector, by virtue of reduced cost and/or size, may be more economically and/or practically incorporated into electronic devices to enable the electronic devices to implement augmented reality (AR), virtual reality (VR), or mixed reality (MR). In addition, the meta projector may be used as a light source to form structured light in depth sensors used for accurate three-dimensional shape recognition. As a result, based on the inclusion of the plurality of nanostructures NS as described herein, a meta projector may address issues associated with practical and/or economic incorporation of projectors associated with user interfaces, augmented reality (AR), virtual reality (VR), or mixed reality (MR), some combination thereof, or the like into electronic devices.

Figure 4:
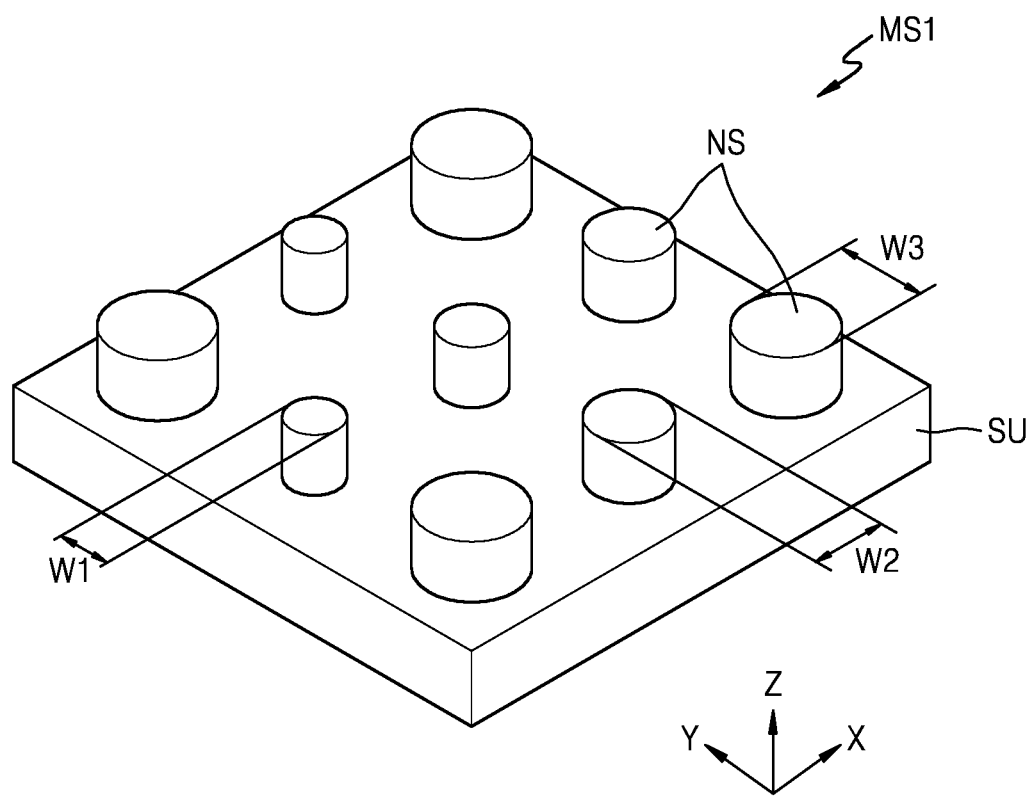
FIG. 4 is a perspective view illustrating an example configuration of another meta-structure layer that may be employed in the meta projector of FIG. 1.

FIG. 4 is a perspective view illustrating an example configuration of another meta-structure layer MS1 applicable to the meta projector 100 of FIG. 1.

A plurality of nanostructures NS provided on the meta-structure layer MS1 may have a random shape distribution in order to form a structured light SL having a particular pattern. FIG. 4 illustrates that the widths w1, w2, w3 of the nanostructures NS are different at different positions. However, this is a non-limiting example. For example, the arrangement positions and shapes of the nanostructures NS may also be random instead of being regular over positions.

FIGS. 5 to 8 are perspective views illustrating example shapes of nanostructures NS that may be applied to ("included in") the meta-structure layer MS of the meta projector 100 illustrated in FIG. 1.

Figure 5:
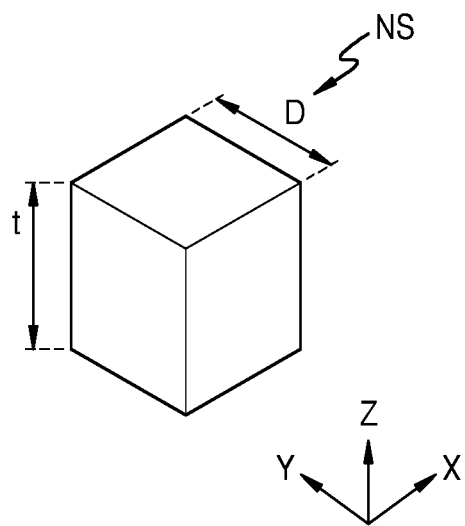
FIGS. 5 to 8 are perspective views illustrating example shapes of nanostructures applicable to the meta-structure layer of the meta projector of FIG. 1.

Referring to FIG. 5, a nanostructure NS may have a tetragonal pillar shape with a thickness (t). The cross-sectional shape of the tetragonal pillar may be a square shape having a length D on a side, but is not limited thereto. For example, the cross-sectional shape of the tetragonal pillar may be rectangular. The nanostructure NS may be modified to have another polygonal pillar shape.

Figure 6:
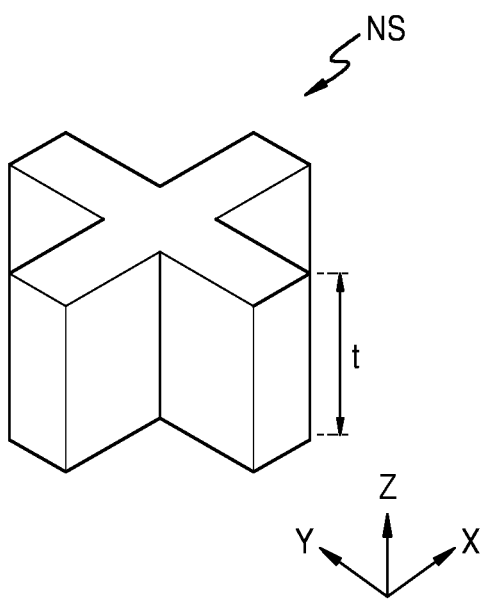

Referring to FIG. 6, the cross-sectional shape of a nanostructure NS may be a cross shape. Although it is illustrated that the nanostructure NS has a symmetric shape, this is an example. That is, the nanostructure NS may alternately have an asymmetric shape. In other words, shapes of cross-sections of the plurality of nanostructures NS parallel to the upper surface 120a of the edge emitting device 120 may have asymmetry.

The nanostructure NS may have an asymmetric shape to form different transmission phase distributions depending on the polarization of incident light.

Figure 7:
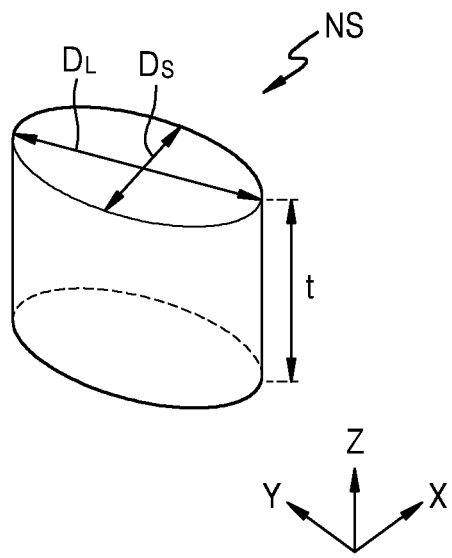

Referring to FIG. 7, a nanostructure NS may have an asymmetric elliptical pillar shape. The nanostructure NS may have an elliptical shape with a major-axis length $D_L$ being different from a minor-axis length $D_S$, and in this case, different transmission phase distributions may appear in polarized light parallel to the major axis and polarized light parallel to the minor axis. That is, different optical operations may be respectively performed on light polarized parallel to the major axis and light polarized parallel to the minor axis.

Figure 8:
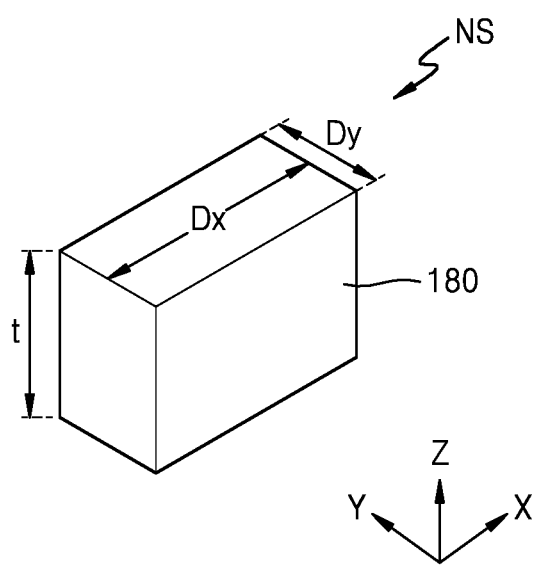

Referring to FIG. 8, a nanostructure NS may have an asymmetric rectangular parallelepiped shape having a rectangular cross-section with a length $D_x$ and a width $D_y$. Like the shape shown in FIG. 7, this shape may result in different transmission phase distributions depending on the polarization of incident light. For example, different optical effects may be obtained depending on the polarization of incident light.

The nanostructures NS having the shapes illustrated in FIGS. 5 to 8, combinations of the nanostructures NS, or modifications thereof may be applied to the meta-structure layer MS of the meta projector 100 shown in FIG. 1 in a regularly arranged form as shown in FIG. 3 or a randomly arranged form as shown in FIG. 4. The shape, size, and arrangement of the nanostructures NS of the Meta-structure layer MS may be determined so as to convert light exiting the edge emitting device 120 into structured light having a pattern. In addition, the shape distribution of the nanostructures NS may be determined so as to control optical performance such as the beam diameter, converging/diverging, and direction of emitted light.

If asymmetric nanostructures NS are employed, the above-described optical operations may be performed on light having specific polarization directions distinguishable by asymmetry. For example, rules for arranging asymmetric nanostructures NS may be varied according to the direction of polarization, so as to obtain different structured light forms from light having different polarizations.

Figure 9:
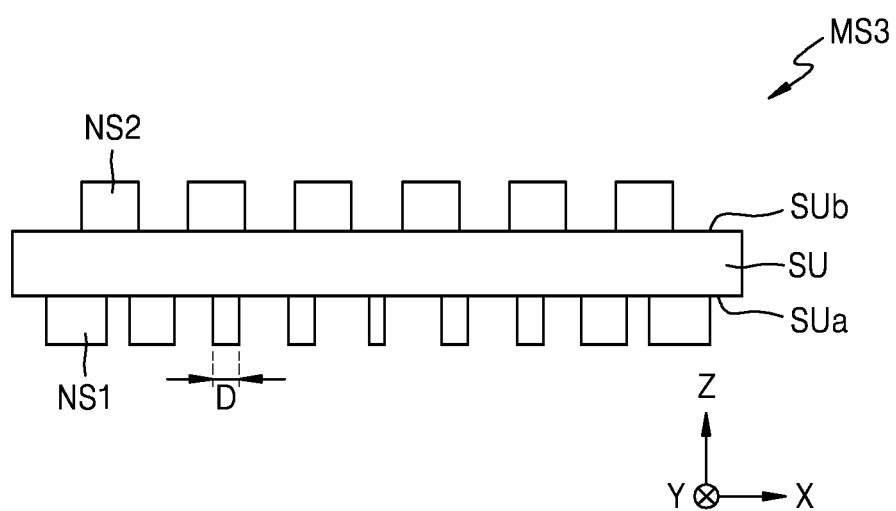
FIG. 9 is a perspective view illustrating an example configuration of another meta-structure layer applicable to the meta projector of FIG. 1.

FIG. 9 is a perspective view illustrating an example configuration of another meta-structure layer MS3 applicable to the meta projector 100 shown in FIG. 1.

The meta-structure layer MS3 may include a plurality of nanostructures NS arranged on each of both sides of a support layer SU, where separate pluralities of nanostructures NS1 and NS2 are on opposite, respective sides of the support layer SU. As shown in FIG. 9, a plurality of nanostructures NS1 may be arranged on a lower surface SUa of the support layer SU to form a predetermined shape distribution, and a plurality of nanostructures NS2 may be arranged on an upper surface SUb of the support layer SU to form another predetermined shape distribution.

The lower surface SUa of the supporting layer SU may face the edge emitting device 120. That is, light 132 emitted from the edge emitting device 120 may first be incident on the lower surface SUa. In this case, the plurality of nanostructures NS1 arranged on the lower surface SUa of the support layer SU may have a particular shape distribution such that the plurality of nanostructures NS1 are configured to increase the divergence angle of incident light. In other words, a plurality of nanostructures NS1 on a light-incident side of the support layer SU, on which the light 132 emitted from the edge emitting device 120 is first incident, may be associated with a shape distribution associated with a transmission phase distribution that increases a divergence angle of incident light 132. For example, the shape and transmission phase distribution of the plurality of nanostructures NS1 may cause the plurality of nanostructures NS1 to perform a function like a concave lens. To this end, the shape distribution of the plurality of nanostructures NS1 may be such that the widths of the plurality of nanostructures NS1 may gradually increase in a radial direction, outward from a reference position. This rule may be repeatedly applied to radial directions, and the period of repetition may not be constant. In addition, the shape and transmission phase distribution of the nanostructures NS1 may be associated with the nanostructures NS1 being configured to function like a concave lens having a cylindrical surface or an ellipsoidal surface.

The plurality of nanostructures NS2 formed on the upper surface SUb of the support layer SU may have a shape distribution such that the nanostructures NS2 convert light 132 having a divergence angle widened by the plurality of nanostructures NS1 into structured light SL having a predetermined pattern.

The shapes of the nanostructures NS1 and NS2 may be selected from the shapes illustrated in FIGS. 5 to 8, combinations thereof, and modifications thereof.

Figure 10:
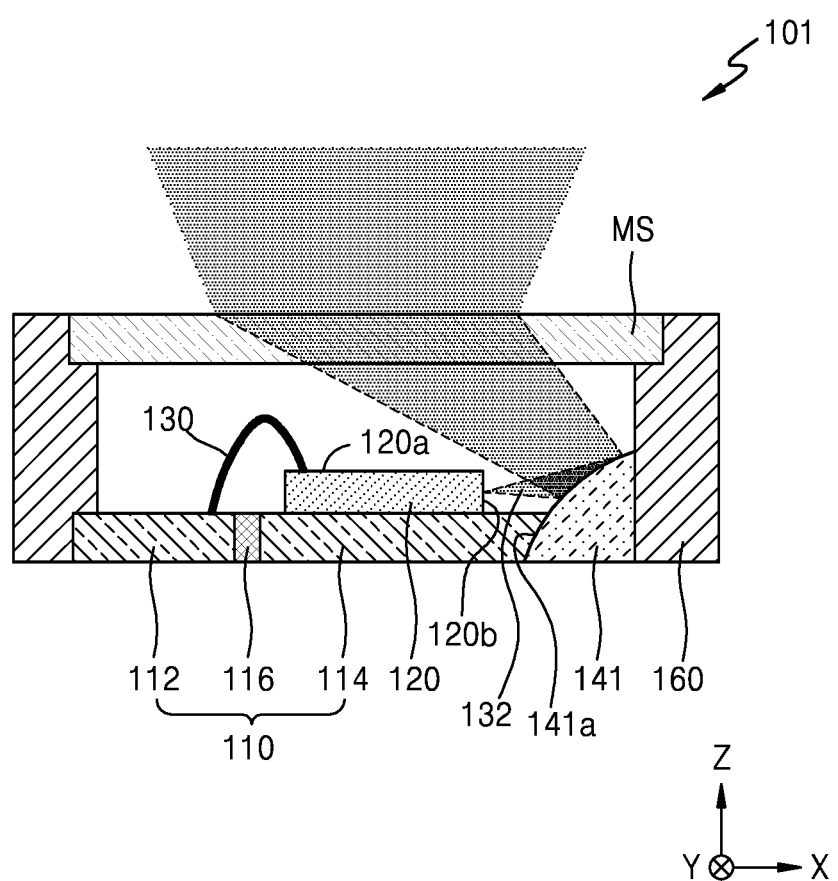
FIG. 10 is a cross-sectional view illustrating a schematic configuration of a meta projector according to an example embodiment.

FIG. 10 is a cross-sectional view schematically illustrating a configuration of a meta projector 101 according to some example embodiments.

In some example embodiments, the meta projector 101 differs from the meta projector 100 illustrated in FIG. 1 in that the shape of a path changing member 141 of the meta projector 101 is different from the shape of the path changing member 140 of the meta projector 100. The path changing member 141 includes a reflective surface 141a configured to bend the propagation path of light 132 by a predetermined angle, and the reflective surface 141a may have a shape having a curved surface configured to adjust the divergence angle of incident light. The reflective surface 141a may be mirror-coated. The curved surface of the reflective surface 141a may be spherical or aspherical, and may have a convex shape as shown in FIG. 10 to increase the divergence angle of incident light.

The illustrated shape of the reflective surface 141a is a non-limiting example. Alternately, the reflective surface 141a may have a concave shape decreasing the divergence angle of incident light, or may have a curved shape varying the diverging direction of incident light according to positions on the reflective surface on which the light is incident.

Figure 11:
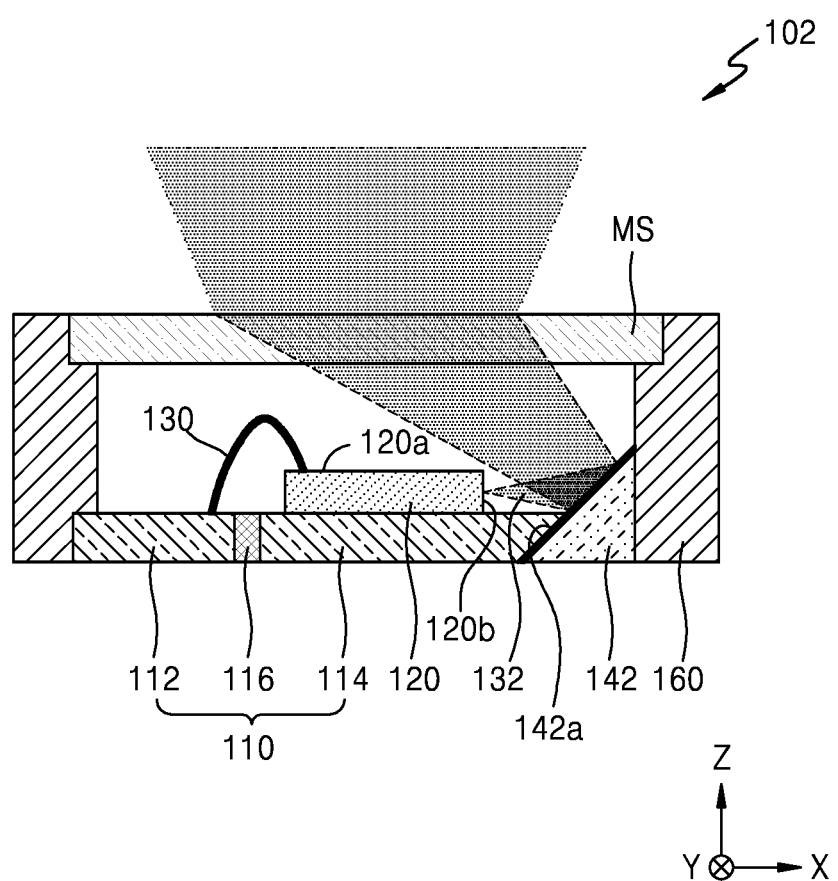
FIG. 11 is a cross-sectional view illustrating a schematic configuration of a meta projector according to an example embodiment.
Figure 12:
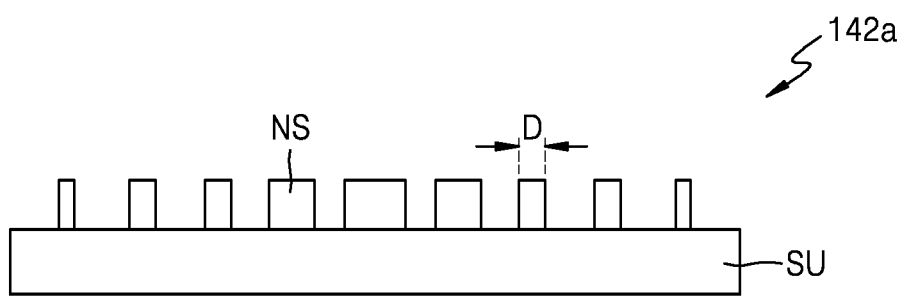
FIG. 12 is a cross-sectional view illustrating an example configuration of a meta-surface of the meta projector of FIG. 11.

FIG. 11 is a cross-sectional view schematically illustrating a configuration of a meta projector 102 according to some example embodiments, and FIG. 12 is a cross-sectional view illustrating an example configuration of a meta-surface 142a of the meta projector 102 illustrated in FIG. 11.

In some example embodiments, a meta projector 102 ay be different from the meta projector 100 illustrated in FIG. 1 in that the reflective surface 142a of a path changing member 142 is also a meta-surface.

Like a meta-structure layer MS, the meta-surface 142a includes a plurality of nanostructures NS having ("associated with") a sub-wavelength dimension smaller than the wavelength of light emitted from an edge emitting device 120. That is, the shapes and shape distributions of the nanostructures NS described with reference to FIGS. 3 to 9 may be applied to the meta-surface 142a.

The shape distribution of the plurality of nanostructures NS of the meta-surface 142a may be determined such that the plurality of nanostructures NS control the divergence angle of incident light 132. For example, as shown in FIG. 12, the shape distribution of the plurality of nanostructures NS may be determined such that the plurality of nanostructures NS perform a function like a convex mirror. The shape distribution of the plurality of nanostructures NS may be so determined such that the widths of the nanostructures NS may gradually decrease in a radial direction from a reference position. This rule may be repeatedly applied to radial directions, and the period of repetition may not be constant. In addition, the shape and transmission phase distribution of the nanostructures NS may be determined such that the plurality of nanostructures perform a function like a convex mirror lens having a cylindrical surface or an ellipsoidal surface.

In some example embodiments, a meta projector may include the meta-surface 142a illustrated in FIG. 11 and may include, in place of a meta-structure layer MS including a plurality of nanostructures NS, a layer configured to refract a structured light SL generated by the meta-surface 142a. The plurality of nanostructures NS included in the meta-surface 142a may have any of the features (e.g., shape distribution) of the plurality of nanostructures NS included in a meta-structure layer MS as described in any of the example embodiments included herein. In some example embodiments, such a layer may be further omitted from the meta projector, such that the meta-surface 142a generates a structured light SL pattern based on light 132 incident thereon, wherein the meta projector is configured to emit the structured light SL generated by the meta-surface 142a. A shape distribution of the plurality of nanostructures of the meta-surface 142a is determined such that structured light SL is formed, which provides a keyboard image in which a set of character keys is arranged or an image including at least one icon.

In view of at least the above, it will be understood that, in some example embodiments, a meta projector that includes the substrate 110 and the edge emitting device 120 further includes a plurality of nanostructures NS configured to receive the light 132 emitted from the edge emitting device 120 and generate a structured light SL pattern based on receiving the light 132 emitted from the edge emitting device, where the plurality of nanostructures NS have a sub-wavelength dimension, the sub-wavelength dimension is smaller than a wavelength of the light emitted from the edge emitting device, and wherein the plurality of nanostructures NS may be included in at least one element of a meta-structure layer MS as described herein and a meta-surface 142a as described herein.

Figure 13:
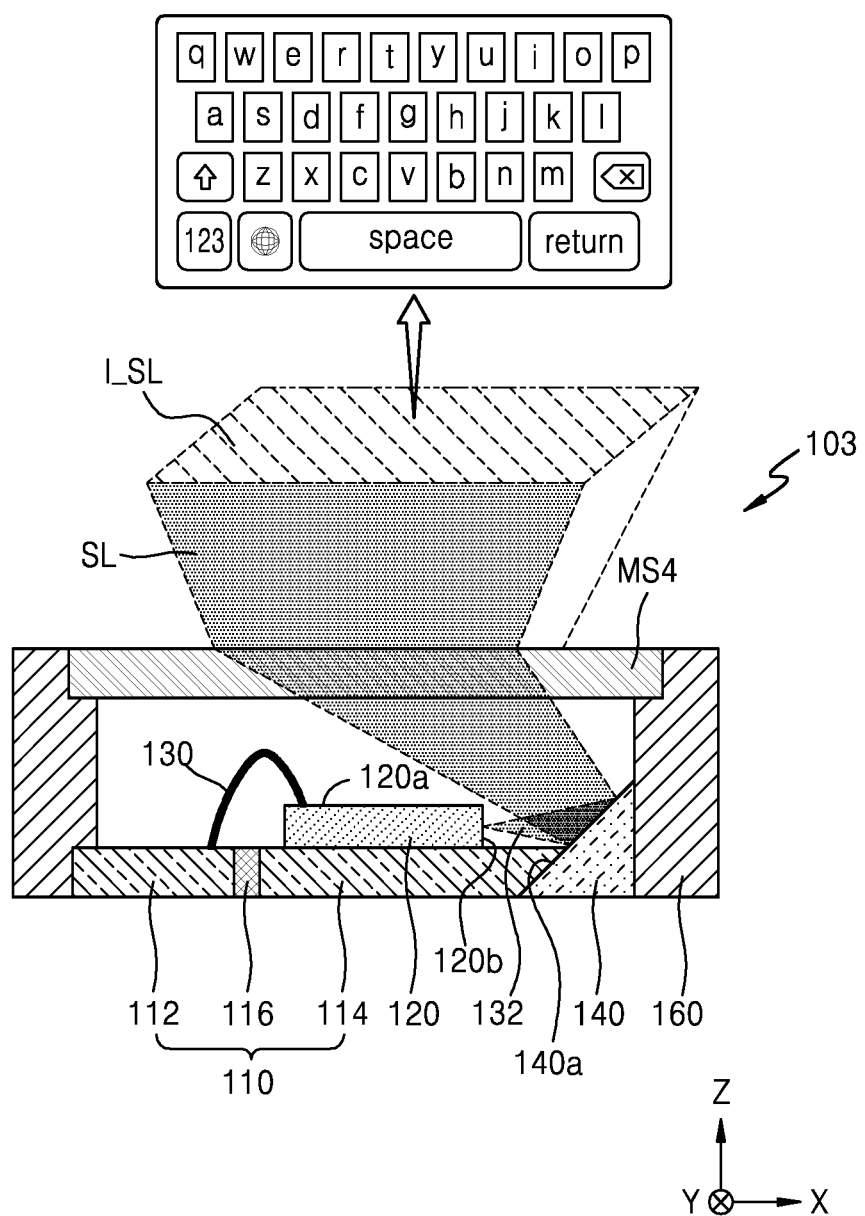
FIG. 13 is a cross-sectional view illustrating a schematic configuration of a meta projector according to an example embodiment.

FIG. 13 is a cross-sectional view schematically illustrating a configuration of a meta projector 103 according to some example embodiments.

In the meta projector 103 according to some example embodiments, details of a meta-structure layer MS4 are determined (e.g., a plurality of nanostructures NS in the meta-structure layer MS4 have a particular shape distribution) such that structured light SL formed by the meta-structure layer MS4 may reproduce a predetermined arbitrary shape. For example, as shown in FIG. 13, a structured light image I_SL formed by the meta-structure layer MS4 may be a keyboard image in which a set of character keys is arranged. The structured light image I_SL formed by the meta-structure layer MS4 may be an image including at least one icon. The meta-structure layer MS4 may include a plurality of nanostructures NS having a shape distribution configured to realize such a structured light pattern based on light 132 being incident on the meta-structure layer MS4.

The illustrated structured light image I_SL is an example. For example, the structured light image I_SL may be an image in which one or more icons or pointers are arranged. That is, the shape distribution of the plurality of nanostructures NS of the meta-structure layer MS4 may be such that any of various images configured to provide an input means as a user interface for a user may be reproduced by the meta projector 103 as structured light images I_SL based on light 132 being incident on meta-structure layer MS4.

Since the above-described meta projectors include meta-structure layers using the shape distribution of nanostructures having a sub-wavelength dimension, the above-described meta projectors may have ultra-small sizes. Therefore, the meta projectors may be applied to any of various electronic apparatuses such as mobile devices or wearable devices. For example, the above-described meta projectors may be used as ultra-small projectors for implementing augmented reality (AR), virtual reality (VR), or mixed reality (MR). In addition, the meta projectors may be used as light sources to form structured light in depth sensors used for accurate three-dimensional shape recognition.

Figure 14:
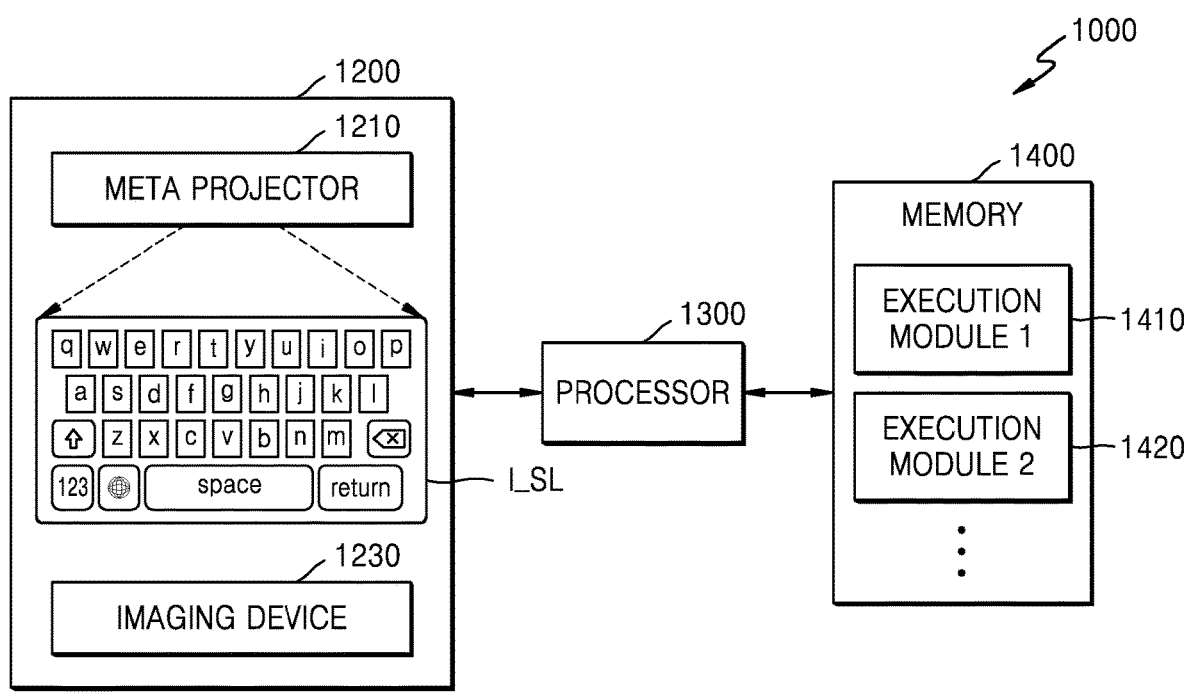
FIG. 14 is a block diagram schematically illustrating a user interface device and an electronic apparatus including the user interface device, according to an example embodiment.

FIG. 14 is a block diagram schematically illustrating a user interface device 1200 and an electronic apparatus 1000 including the user interface device 1200 according to some example embodiments.

The electronic apparatus 1000 includes the user interface device 1200, a processor 1300, and a memory 1400.

The user interface device 1200 includes a meta projector 1210 configured to reproduce a predetermined structured light image I_SL and an imaging device 1230 configured to photograph the structured light image I_SL formed by the meta projector 1210.

The structured light image I_SL reproduced by the meta projector 1210 may be a keyboard image in which a set of character keys is arranged as shown in FIG. 14, but is not limited thereto. For example, the structured light image I_SL may be an image in which one or more icons or pointers are arranged.

A user may express input information using the character keys shown in the structured light image I_SL. That is, a user may perform a desired input operation by touching character keys shown on the keyboard of the structured light image I_SL with his/her fingers.

The imaging device 1230 is placed to photograph the structured light image I_SL. Images taken by the imaging device 1230 may be transmitted to the processor 1300 to extract a user input signal.

The processor 1300 is responsible for all processing and controlling operations of the electronic apparatus 1000. In addition, the processor 1300 may extract a user input signal from images captured by the imaging device 1230 and may execute one of any execution modules ("programs of instruction") stored in a memory 1400 according to the extracted user input signal.

The memory 1400 may store one or more execution modules 1410 and 1420 that may be executed by the processor 1300, and data necessary for executing the execution modules 1410 and 1420.

In addition, the memory 1400 may store modules for any of various applications to be executed by the electronic apparatus 1000, and according to devices included in the electronic apparatus 1000, the memory 1400 may further include modules such as a communication module, a camera module, a video replay module, and an audio replay module.

The memory 1400 may include at least one type of recording medium selected from a flash memory, a hard disk, a micro multimedia card, a memory card (e.g., a secure digital (SD) card or an extreme digital (XD) card), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk.

For example, the electronic apparatus 1000 may be a portable mobile communication device, a smart phone, a smart watch, a personal digital assistant (PDA), a laptop, a personal computer (PC), a mobile computing device, or a non-mobile computing device. However, the electronic apparatus 1000 is not limited thereto.

Since the user interface device 1200 including the meta projector 1210 is configured to provide a structured light image I_SL as an input interface, the electronic apparatus 1000 may omit, for example, a real keyboard. Alternatively, the electronic apparatus 1000 may include a real keyboard, and a user may select whether to use the real keyboard or a keyboard provided by a structured light image I_SL.

Figure 15:
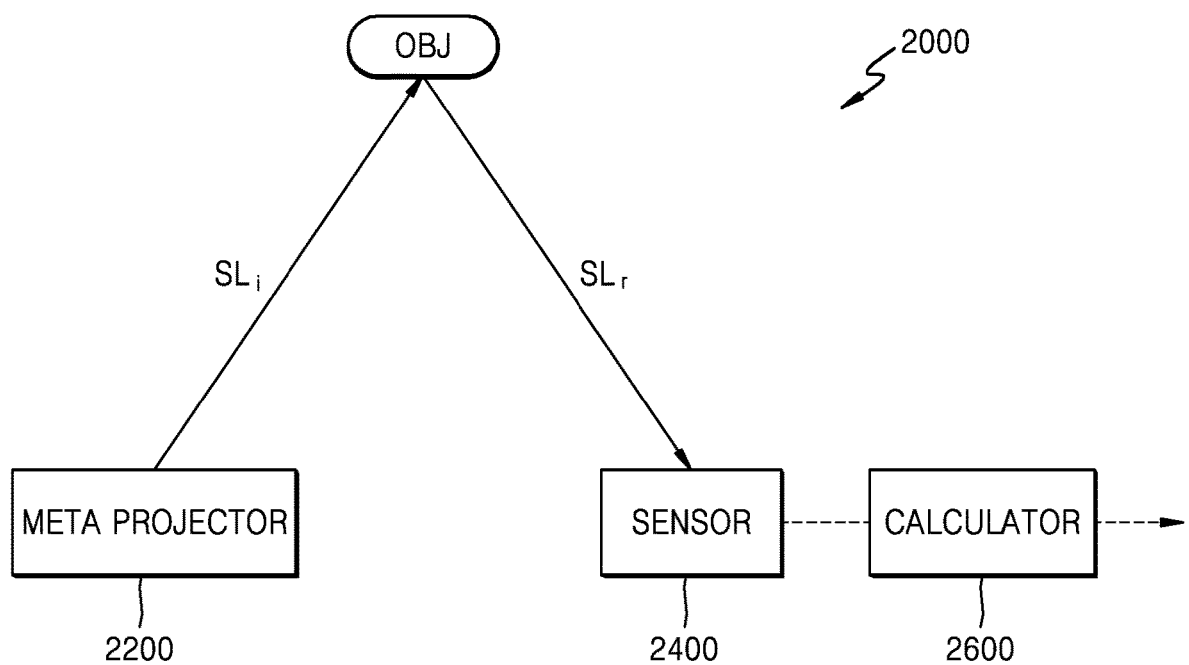
FIG. 15 is a block diagram illustrating a schematic configuration of a depth recognition apparatus according to an example embodiment.

FIG. 15 is a block diagram schematically illustrating a configuration of a depth recognition apparatus 2000 according to some example embodiments.

The depth recognition apparatus 2000 includes a meta projector 2200 configured to emit structured light $SL_i$ toward an object OBJ, a sensor 2400 configured to receiving structured light $SL_r$ reflected from the object OBJ, and a calculator 2600 configured to calculate a depth position of the object OBJ by comparing a pattern change between the structured light $SL_i$ emitted from the meta projector 2200 and the structured light $SL_r$ received by the sensor 2400.

The meta projector 2200 may convert light (e.g., light 132) emitted from an edge emitting device into structured light (e.g., structured light SL) having a predetermined pattern and may output the structured light. The meta projector 2200 may include any one of the meta projectors 100, 101, and 102 of the above-described example embodiments or a combination thereof.

The sensor 2400 senses the structured light $SL_r$ reflected from the object OBJ. The sensor 2400 may include an array of light detecting elements. The sensor 2400 may further include a spectroscopic element to analyze light reflected from the object OBJ according to wavelengths.

The calculator 2600 may compare the structured light $SL_i$ emitted toward the object OBJ with the structured light $SL_r$ reflected from the object OBJ so as to obtain depth information about the object OBJ and may determine the three-dimensional shape, position, motion, or the like, of the object OBJ based on the depth information. The structured light $SL_i$ generated by the meta projector 2200 is a pattern mathematically coded so as to uniquely designate angular position coordinates using bright and dark points. When such a pattern is incident on the object OBJ having a three-dimensional shape and is then reflected from the object OBJ, the pattern of reflected structured light $SL_r$ is different from the pattern of incident structured light $SL_i$. Depth information about the object OBJ may be extracted by comparing such patterns and tracing patterns according to coordinates, and in this manner, three-dimensional information about the shape and motion of the object OBJ may be extracted.

Additional optical elements may be arranged between the meta projector 2200 and the object OBJ so as to adjust the direction of structured light $SL_i$ emitted from the meta projector 2200 toward the object OBJ or additionally modulate the structured light $SL_i$.

In addition, the depth recognition apparatus 2000 may further include: a controller configured to generally control the operation of a light source of the meta projector 2200 or the operation of the sensor 2400; and a memory storing a calculation program to be used when the calculator 2600 performs three-dimensional information extraction.

Results of calculations of the calculator 2600, that is, information about the shape and position of the object OBJ may be transmitted to another unit. For example, such information may be transmitted to a controller of an electronic apparatus including the depth recognition apparatus 2000. A unit to which results of calculation are transmitted may be a display device or a printer configured to output the results. In some example embodiments, the unit may be a smartphone, a cellular phone, a personal digital assistant (PDA), a laptop, a personal computer (PC), a wearable device, a mobile device, or a non-mobile computing device. However, the other unit is not limited to the listed devices.

The depth recognition apparatus 2000 may be used as a sensor configured to precisely acquire three-dimensional information about an object and thus may be applied to any of various electronic apparatuses. Examples of such various electronic apparatuses may include: an autonomous driving apparatus such as an unmanned vehicle, an autonomous driving vehicle, an autonomous riving robot, or an autonomous driving drone; a mobile communication apparatus; and an Internet of Things (IoT) apparatus.

Figure 16:
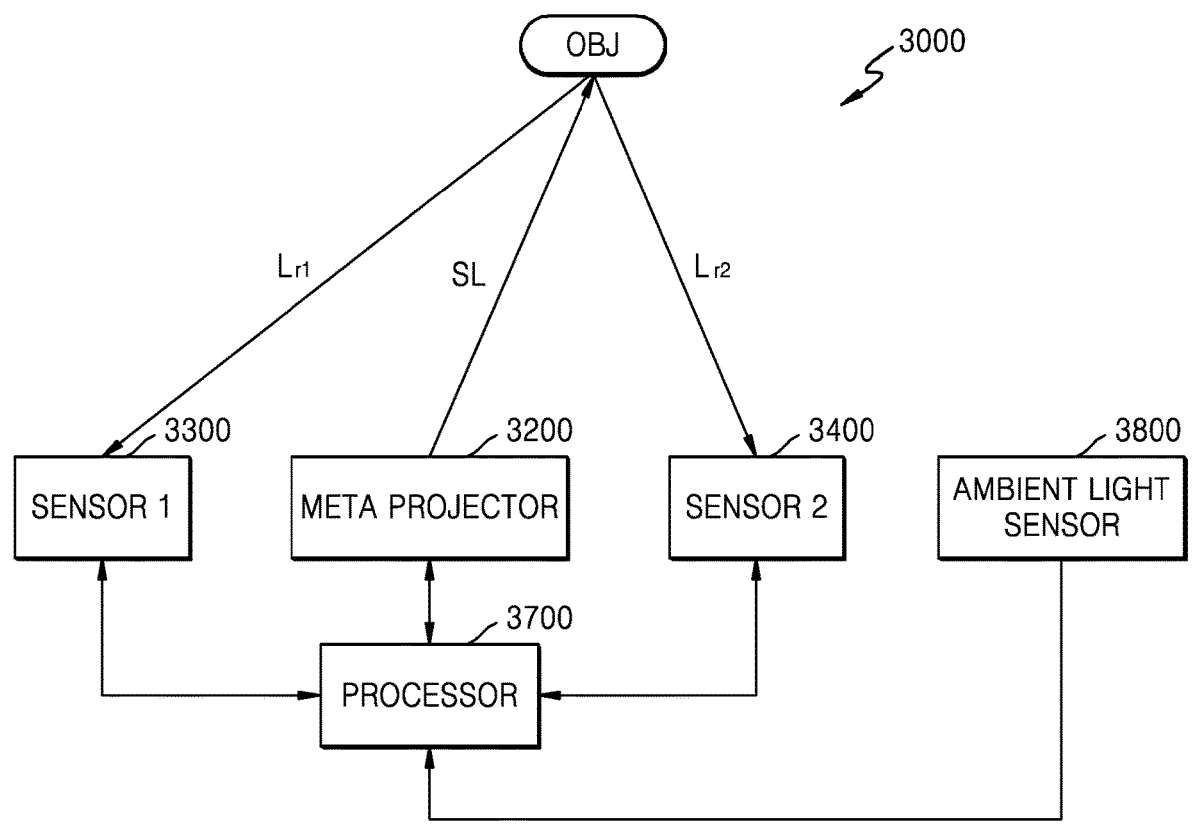
FIG. 16 is a block diagram illustrating a schematic configuration of a depth recognition apparatus according to an example embodiment.

FIG. 16 is a block diagram illustrating a schematic configuration of a depth recognition apparatus 3000 according to some example embodiments;

The depth recognition apparatus 3000 includes a meta projector 3200 configured to emit structured light SL toward an object OBJ, first and second sensors 3300 and 3400 placed at different positions with respect to the meta projector 3200 and configured to sense light coming from the object OBJ, and a processor 3700 configured to calculate a depth position of the object OBJ by analyzing light received by at least one of the first and second sensors 3300 and 3400.

The meta projector 3200 may convert light emitted from an edge emitting device into structured light having a predetermined pattern and may output the structured light. The meta projector 3200 may include any one of the meta projectors 100, 101, and 102 of the above-described example embodiments or a combination thereof.

Each of the first and second sensors 3300 and 3400 may include an array of light detecting elements. The first and second sensors 3300 and 3400 are placed at different positions relative to the meta projector 3200, and thus when the first and second sensors 3300 and 3400 sense light coming from the object OBJ, image information from different respective viewpoints. In some example embodiments, accuracy may be improved compared to the above-described embodiments in which only one sensor is used, and information about the depth of the object OBJ may be obtained by any of various methods according to usage environments. For example, the processor 3700 may analyze structured light SL which is emitted from the meta projector 3200 and reflected from the object OBJ. Alternatively, when the illuminance of ambient light is proper, the meta projector 3200 may not be used, and the processor 3700 may analyze ambient light reflected from the object OBJ.

In addition, the depth recognition apparatus 3000 may further include an ambient light sensor 3800. The ambient light sensor 3800 may sense the intensity of ambient light, and when the magnitude of a signal sensed by the ambient light sensor 3800, for example, the intensity of infrared rays included in the ambient light, is equal to or greater than a given value, the processor 3700 may turn off the meta projector 3200 and analyze ambient light reflected from the object OBJ to calculate information about the depth of the object OBJ. Various modes in which the processor 3700 operates to obtain depth information will be described later with reference to FIGS. 18 to 24.

The first sensor 3300, the meta projector 3200, and the second sensor 3400 may be arranged in a line at given intervals. In FIG. 16, the meta projector 3200 is placed between the first and second sensors 3300 and 3400. However, this is a non-limiting example.

Figure 17A:
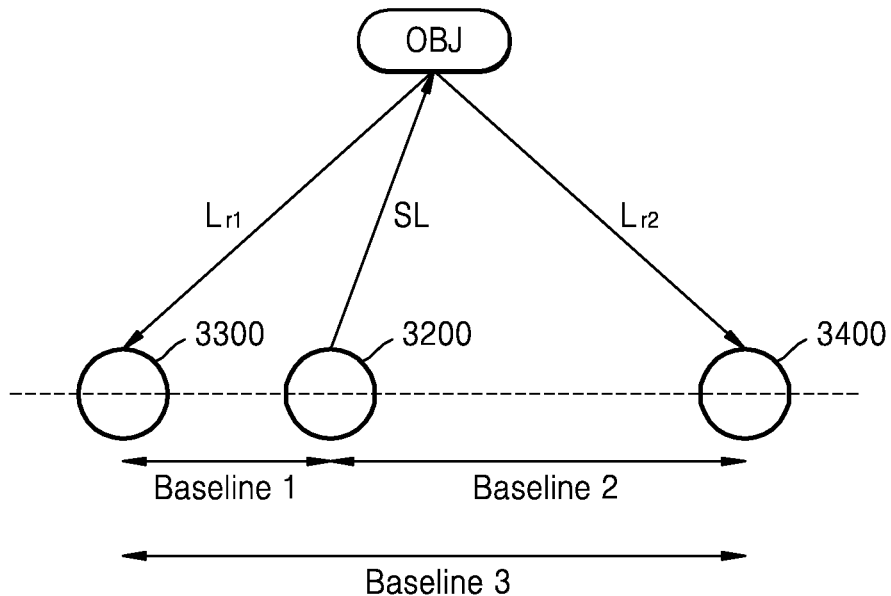
FIGS. 17A to 17C are views illustrating example arrangements of a plurality of sensors and a meta projector in the depth recognition apparatus shown in FIG. 16.
Figure 17B:
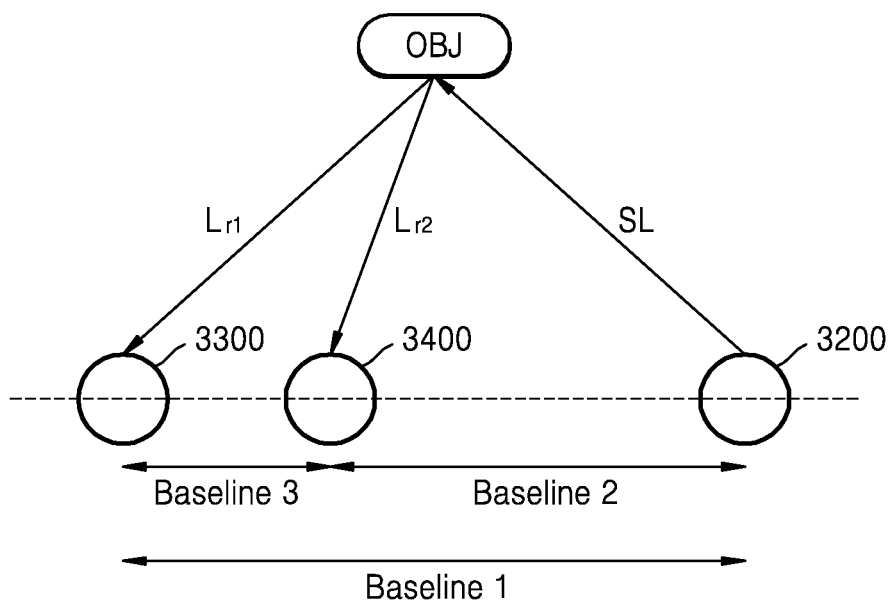
Figure 17C:
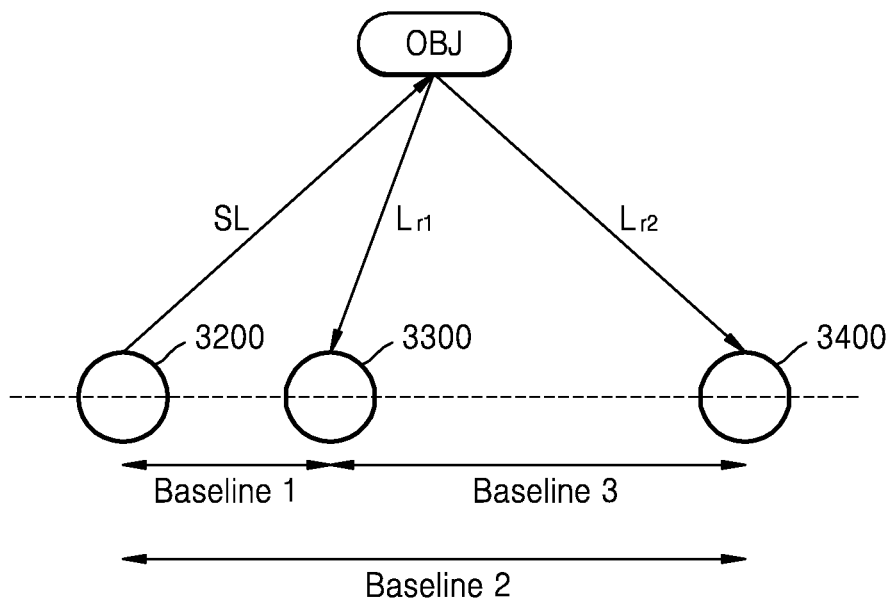

FIGS. 17A to 17C are views illustrating example arrangements of the first and second sensors 3300 and 3400 and the meta projector 3200 in the depth recognition apparatus 3000 shown in FIG. 16.

When the distance between the first sensor 3300 and the meta projector 3200, the distance between the second sensor 3400 and the meta projector 3200, and the distance between the first and second sensors 3300 and 3400 are indicated by baseline 1, baseline 2, and baseline 3, respectively, there may be various combinations with baselines 1, 2, and 3 having any of various values.

Referring to FIG. 17A, the meta projector 3200 and the first and second sensors 3300 and 3400 may be arranged such that the meta projector 3200 may be placed between the first and second sensors 3300 and 3400 in a condition of baseline 1<baseline 2<baseline 3.

Referring to FIG. 17B, the meta projector 3200 and the first and second sensors 3300 and 3400 may be arranged such that the second sensor 3400 may be placed between the meta projector 3200 and the first sensor 3300 in a condition of baseline 3<baseline 2<baseline 1.

Referring to FIG. 17C, the meta projector 3200 and the first and second sensors 3300 and 3400 may be arranged such that the first sensor 3300 may be placed between the meta projector 3200 and the second sensor 3400 in a condition of baseline 1<baseline 3<baseline 2.

Figure 18:
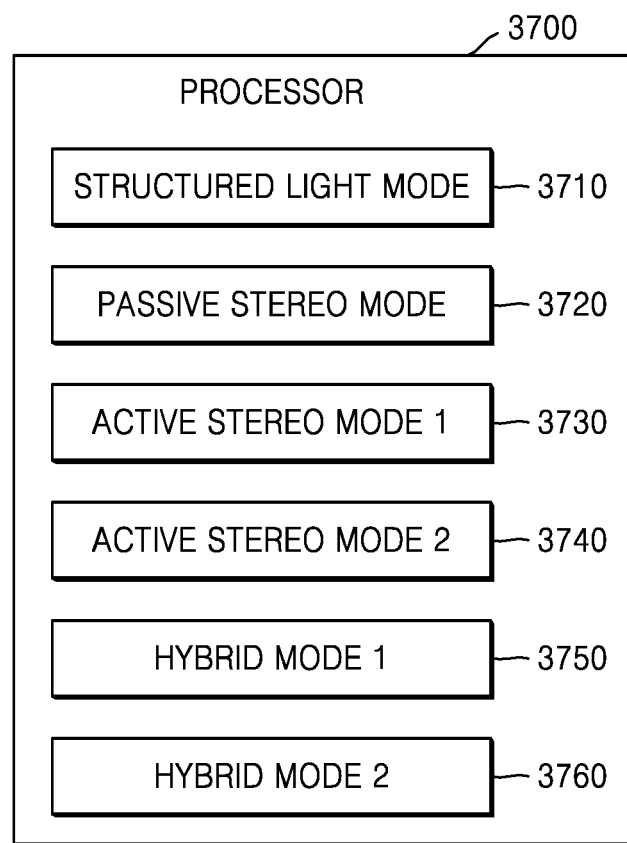
FIG. 18 is a view illustrating modes in which a processor of the depth recognition apparatus shown in FIG. 16 operates.

FIG. 18 is a view illustrating modes in which the processor 3700 of the depth recognition apparatus 3000 shown in FIG. 16 operates. FIGS. 19 to 24 are block diagrams illustrating operations and processing in the example execution modes shown in FIG. 18.

The processor 3700 may operate selectively in one of a structured light mode 3710, a passive stereo mode 3720, a first active stereo mode 3730, a second active stereo mode 3740, a first hybrid mode 3750, and a second hybrid mode 3760.

A program for operations in the different modes may be stored in a memory, and the processor 3700 may execute the program.

The processor 3700 may select one of the modes and operate in the selected mode according to a user's input or a control signal from another execution module.

Referring to FIG. 19, in the structured light mode 3710, a meta projector is controlled to be turned on. That is, the meta projector emits structured light toward an object, and one of first and second sensors receives light reflected from the object. Image data obtained using the one of the first and second sensors may be compared with the pattern of the structured light emitted by the meta projector and may be analyzed to obtain depth information about the object. The one of the first and second sensors to be used for depth information analysis may be determined according to usage environments. For example, the one of the first and second sensors resulting in a better image may be selected according to the position of the object.

Referring to FIG. 20, in the passive stereo mode 3720, the meta projector is controlled to be turned off. That is, the meta projector does not emit structured light toward the object. This mode may be used when the intensity of ambient light is sufficient. Image data 1 about the object may be obtained from a signal that the first sensor outputs when receiving ambient light reflected from the object, image data 2 about the object may be obtained from a signal that the second sensor outputs when receiving ambient light reflected from the object, and depth information about the object may be obtained from the image data 1 and the image data 2.

Figure 21:
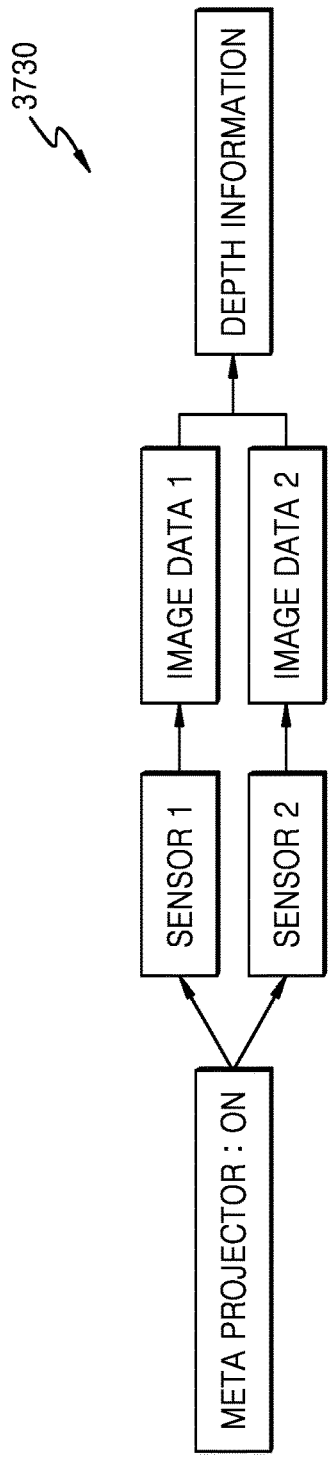

Referring to FIG. 21, in the first active stereo mode 3730, the meta projector is controlled to be turned on. That is, the meta projector emits structured light toward the object, and both the first and second sensors receive light reflected from the object. Image data 1 obtained using the first sensor and image data 2 obtained using the second sensor are image data from different view points and may be analyzed to obtain depth information about the object.

Figure 22:
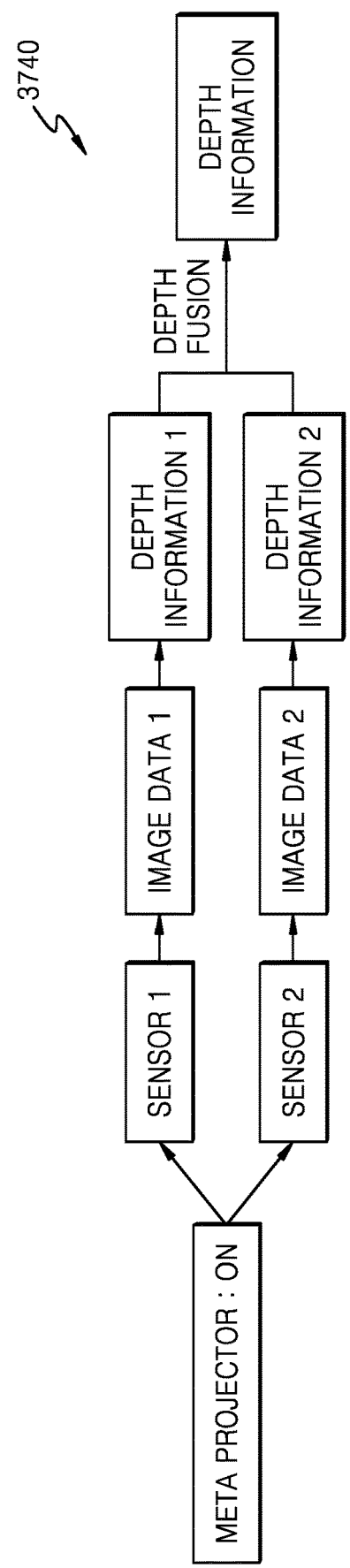

Referring to FIG. 22, in the second active stereo mode 3740, the meta projector is controlled to be turned on. That is, the meta projector emits structured light toward the object, and both the first and second sensors receive light reflected from the object. Image data 1 is obtained from the first sensor that receives structured light emitted by the meta projector and reflected from the object, and depth information 1 may be obtained from the image data 1. In the same manner, depth information 2 may be obtained from image data 2 of the second sensor. The depth information 1 and the depth information 2 may be combined to obtain final depth information, and the final depth information may be more accurate than the depth information obtained using only one of the first and second sensors in the structured light mode 3710 described with reference to FIG. 19.

Figure 23:
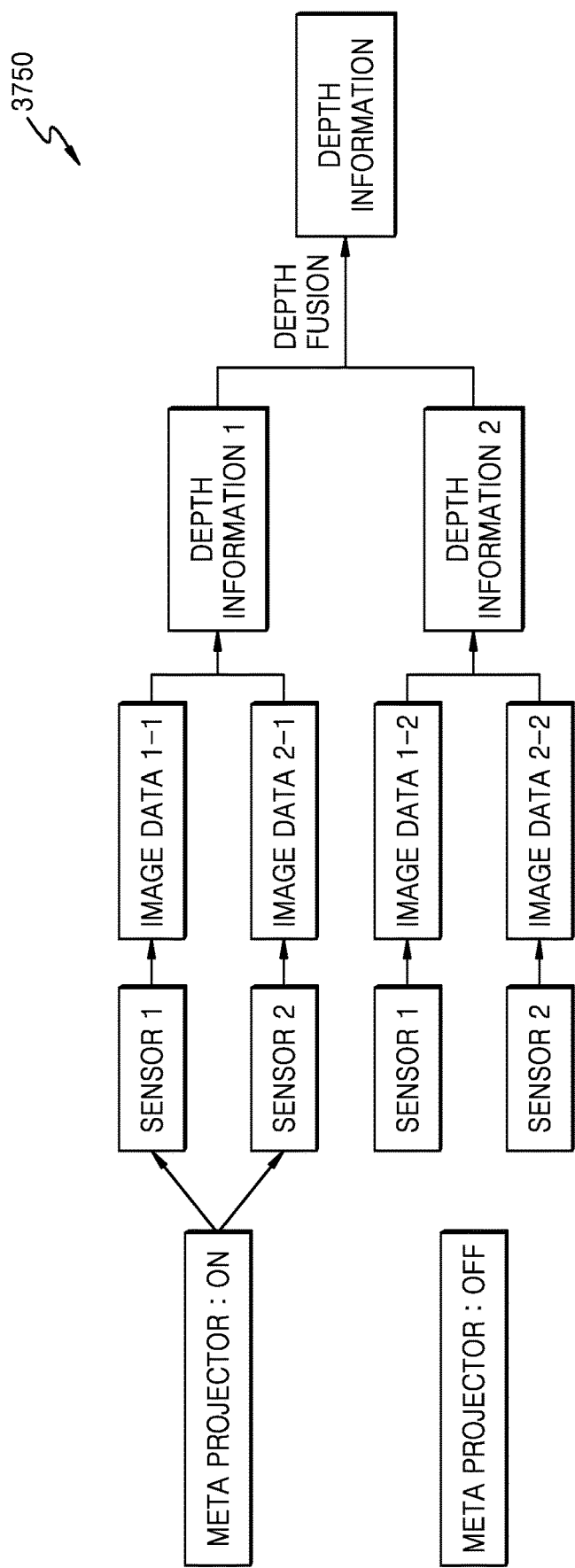

Referring to FIG. 23, in the first hybrid mode 3750, the meta projector is controlled to be alternately turned on and off to obtain depth information 1 and depth information 2 in the respective states, and the depth information 1 and the depth information 2 are combined to obtain final depth information.

The meta projector is controlled to be turned on, and image data 1-1 and image data 2-1 are respectively obtained from light received at the first sensor and light received at the second sensor. The depth information 1 about the object is calculated from the image data 1-1 and the image data 2-1. The depth information 1 may be obtained in the same manner as the depth information is obtained in the first active stereo mode 3730 described with reference to FIG. 21. However, the depth information 1 is not limited thereto. For example, the depth information 1 may be obtained in the same manner as the depth information is obtained in the second active stereo mode 3740 described with reference to FIG. 22.

In addition, the meta projector is controlled to be turned off, and image data 1-2 and image data 2-2 are respectively obtained from light received at the first sensor and light received at the second sensor. The depth information 2 about the object is calculated from the image data 1-2 and the image data 2-2. The depth information 2 may be obtained in the same manner as the depth information is obtained in the passive stereo mode 3720 described with reference to FIG. 20.

Next, the depth information 1 and the depth information 2 are combined to obtain the final depth information.

Figure 24:
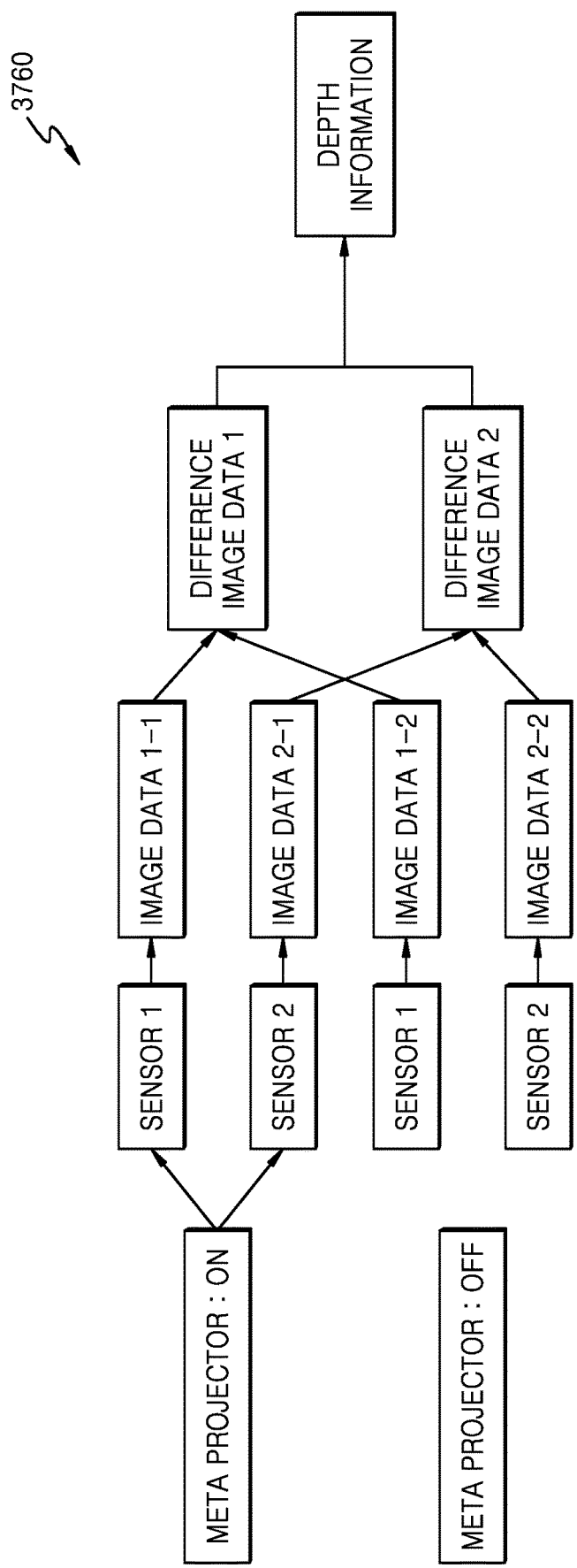

Referring to FIG. 24, in the second hybrid mode 3760, the meta projector is controlled to be alternately turned on and off to obtain difference image data 1 and difference image data 2 in the respective states, and the difference image data 1 and the difference image data 2 are combined to obtain final depth information.

The meta projector is controlled to be turned on, and image data 1-1 and image data 2-1 are respectively obtained from light received at the first sensor and light received at the second sensor. In addition, the meta projector is controlled to be turned off, and image data 1-2 and image data 2-2 are respectively obtained from light received at the first sensor and light received at the second sensor.

The difference image data 1 is calculated from the difference between the image data 1-1 and the image data 1-2, and the difference image data 2 is calculated from the difference between the image data 2-1 and the image data 2-2.

To obtain the difference image data 1, for example, a matrix formed of image data 1-2, {image data 1-2}, that is obtained using the first sensor when the meta projector is turned off may be subtracted from the matrix formed of image data 1-1, {image data 1-1}, that is obtained using the first sensor when the meta projector is turned on. In other words, the difference image data 1 is obtained using the first sensor from light which is reflected from the object and involves only structured light without the influence of ambient light.

In the same manner, to obtain the difference image data 2, a matrix formed of image data 2-2, {image data 2-2}, that is obtained using the second sensor when the meta projector is turned off may be subtracted from the matrix formed of image data 2-1, {image data 2-1} that is obtained using the second sensor when the meta projector is turned on. In other words, the difference image data 2 is obtained using the second sensor from light which is reflected from the object and involves only structured light without the influence of ambient light.

The difference image data 1 and the difference image data 2 are data obtained using the first and second sensors placed at different view points, and may be used to calculate depth information about the object.

Figure 25:
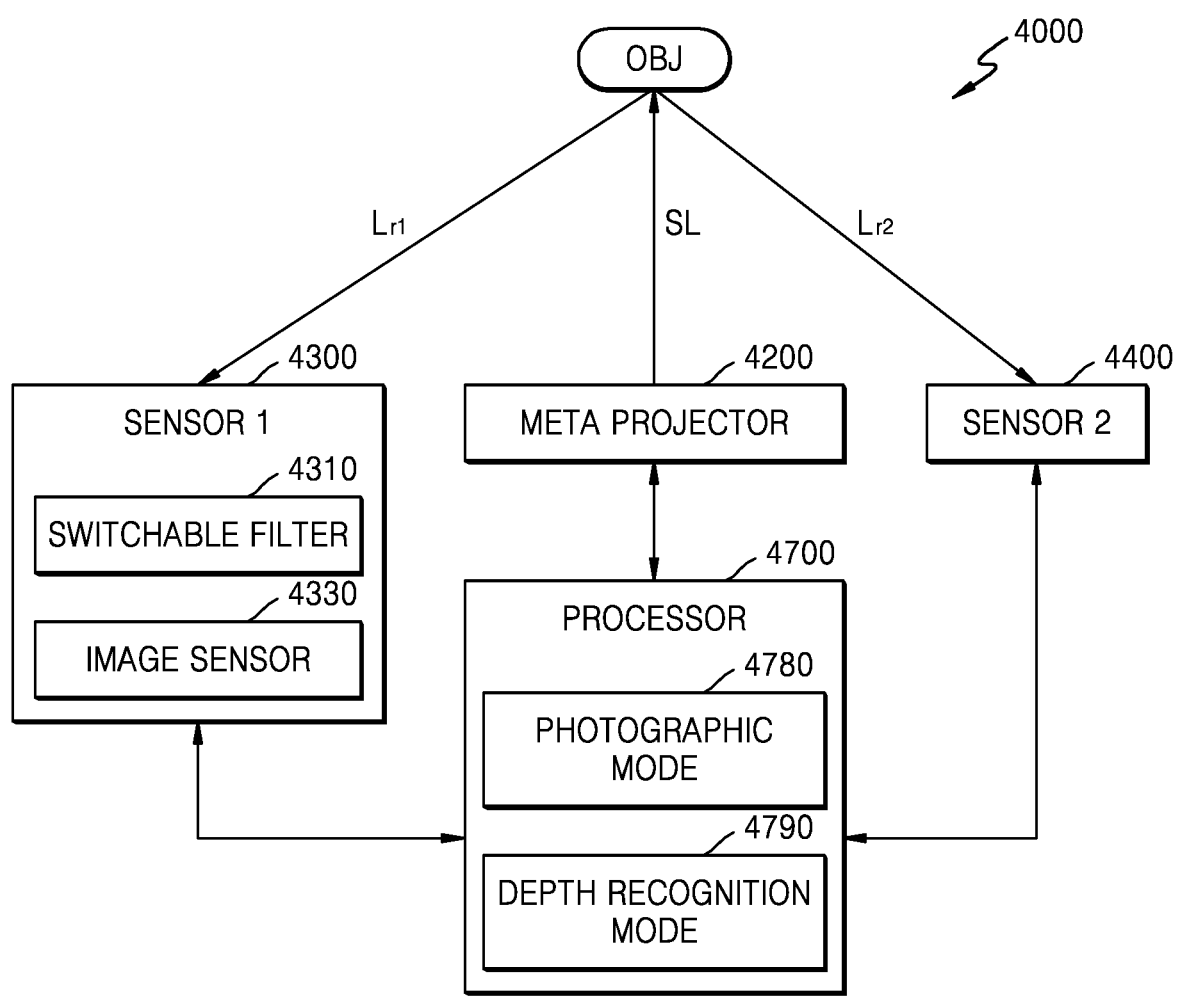
FIG. 25 is a block diagram illustrating a schematic configuration of a depth recognition apparatus according to an example embodiment.

FIG. 25 is a block diagram illustrating a schematic configuration of a depth recognition apparatus 4000 according to some example embodiments.

The depth recognition apparatus 4000 includes a meta projector 4200, a first sensor 4300, a second sensor 4400, and a processor 4700.

The meta projector 4200 may convert light emitted from an edge emitting device into structured light having a predetermined pattern and may output the structured light. The meta projector 3200 may include any one of the meta projectors 100, 101, and 102 of the above-described example embodiments or a combination thereof.

The first sensor 4300 and the second sensor 4400 may be placed at different positions relative to the meta projector 4200, and the processor 4700 may obtain depth information about an object OBJ from light coming from the object OBJ and sensed by at least one of the first and second sensors 4300 and 4400.

The depth recognition apparatus 4000 has a configuration in which sensors for depth recognition may also be used for normal photographing. As illustrated in FIG. 25, the first sensor 4300 includes a switchable filter 4310 that may be operated in an infrared cut-off mode or an infrared transmission mode, and an image sensor 4330 configured to sense light transmitted through the switchable filter 4310. However, this is a non-limiting configuration. Alternatively, the second sensor 4400 may include a switchable filter and an image sensor.

The processor 4700 controls the first sensor 4300 according to a normal photographic mode 4780 or a depth recognition mode 4790. In the normal photographic mode 4780, the switchable filter 4310 is controlled to block infrared rays, and thus an object image may be obtained from visible light reflected from the object OBJ and sensed by the image sensor 4330. In the depth recognition mode 4790, the switchable filter 4310 may be controlled to transmit infrared rays. Infrared image data for obtaining depth information is obtained from infrared rays reflected from the object OBJ and sensed by the image sensor 4330. In the depth recognition mode 4790, both the first sensor 4300 and the second sensor 4400 may be used, and the depth recognition mode 4790 may include the above-described various modes in which the processor 3700 of the depth recognition apparatus 3000 operates.

In the above-described meta projectors, light emitted from an edge emitting device may be converted into structured light having any of various patterns by a meta-structure layer having sub-wavelength nanostructures.

The above-described meta projectors may be easily implemented as integrated modules having ultra-small sizes.

The above-described meta projectors may be applied to any of various electronic apparatuses. For example, the above-described meta projectors may be applied to depth recognition apparatuses for precise motion sensing and three-dimensional shape sensing.

The operations described in the example embodiments are examples which are not intended to limit the scope of the inventive concepts. In the present disclosure, descriptions of known electric components, control systems, software, and other functional aspects thereof may not be given for conciseness. Furthermore, in the drawings, connection lines or members between elements are functional, physical, and/or electric connections illustrated as examples that can be replaced with or used together with other functional, physical, and/or electrical connections.

Example embodiments have been described and illustrated with reference to the accompanying drawings to help understanding of the inventive concepts. However, these embodiments are merely exemplary and do not limit the scope of the inventive concepts. In addition, it will be understood that the inventive concepts are not limited to those illustrated and described in the present disclosure. That is, those of ordinary skill in the art may make various modifications thereto.

It should be understood that example embodiments described herein should be considered in a descriptive sense only and not for purposes of limitation. Descriptions of features or aspects within some example embodiments should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A depth recognition apparatus comprising:
   a meta projector;
   a first sensor disposed in a first position with respect to the meta projector, and configured to receive light from an object;
   a second sensor, disposed in a second position with respect to the meta projector, different from the first position, and configured to receive light form the object; and
   a processor configured to analyze the light received by at least one of the first and second sensors and thereby calculate a depth position of the object,
   wherein the meta projector comprises:
   an edge emitting device disposed on a substrate, the edge emitting device comprising an upper surface extending parallel to the substrate and a side surface inclined relative to the upper surface, the edge emitting device configured to emit light through the side surface;
   a meta-structure layer spaced apart from the upper surface of the edge emitting device, the meta-structure layer comprising:
     a support layer comprising a first surface facing the edge emitting device and a second surface opposite to the first surface;
     a first plurality of nanostructures disposed on the first surface; and
     a second plurality of nanostructures disposed on the second surface, each of the first plurality of nanostructures and each of the second plurality of nanostructures having a dimension that is smaller than a wavelength of the light emitted from the edge emitting device; and
   a path changing member configured to change a path of the light emitted from the edge emitting device to direct the path toward the meta-structure layer,
   wherein a shape distribution of the first plurality of nanostructures and the second plurality of nanostructures is configured to form structured light using the light emitted from the edge emitting device, and a pattern of the structured light is mathematically coded to uniquely designate angular position coordinates using bright and dark points.

2. The depth recognition apparatus of claim 1, wherein the processor is configured to:
obtain first image data from light received by the first sensor;
obtain second image data from light received by the second sensor; and
calculate the depth position of the object based on the first image data and the second image data.

3. The depth recognition apparatus of claim 1, wherein the processor is further configured to:
obtain first depth information about the object by analyzing the structured light emitted from the meta projector onto the object and the light received by the first sensor;
obtain second depth information about the object by analyzing the structured light emitted from the meta projector onto the object and the light received by the second sensor; and
calculate the depth position of the object based on the first depth information and the second depth information.

4. The depth recognition apparatus of claim 1, further comprising an ambient light sensor configured to sense illuminance in an area surrounding the object,
wherein the processor is further configured to turn off the meta projector based on a signal sensed by the ambient light sensor being equal to or greater than a given value.

5. The depth recognition apparatus of claim 4, wherein when the meta projector is in an off-state, the processor is further configured to:
obtain first image data about the object from a signal output from the first sensor based on ambient light reflected from the object and received by the first sensor;
obtain second image data about the object from a signal output from the second sensor based on ambient light reflected from the object and received by the second sensor; and
calculate the depth position of the object based on the first image data and the second image data.

6. The depth recognition apparatus of claim 1, wherein the processor is further configured to:
when the meta projector is on, obtain primary-first image data and secondary-first image data based on light received by the first sensor and the second sensor, respectively; and
when the meta projector is off, obtain primary-second image data and secondary-second image data from light received by the first sensor and the second sensor, respectively.

7. The depth recognition apparatus of claim 6, wherein the processor is further configured to:
calculate first depth information about the object based on the primary-first image data and the secondary-first image data;
calculate second depth information about the object based on the primary-second image data and the secondary-second image data; and
calculate the depth position of the object based on the first depth information and the second depth information.

8. The depth recognition apparatus of claim 6, wherein the processor is further configured to:
calculate first difference image data based on a difference between the primary-first image data and the primary-second image data;
calculate second difference image data based on a difference between the secondary-first image data and the secondary-second image data; and
calculate the depth position of the object based on the first difference image data and the second difference image data.

9. The depth recognition apparatus of claim 1, wherein at least one of the first sensor and the second sensor comprises:
a switchable filter configured to be switched between an infrared-cut mode, in which infrared light is blocked, and an infrared transmission mode, in which infrared light is transmitted therethrough; and
an image sensor configured to sense light transmitted through the switchable filter.

10. The depth recognition apparatus of claim 9, wherein the processor is further configured to control the switchable filter to block infrared light in a normal photographic mode and to transmit infrared light in a depth recognition mode.

11. The depth recognition apparatus of claim 1, further comprising:
a housing fixing the substrate, the meta-structure layer, and the path changing member, such that the meta projector is an integrated module.

12. The depth recognition apparatus of claim 1, wherein each of the first plurality of nanostructures and each of the second plurality of nanostructures comprise a material having a refractive index higher than a refractive index of a material adjacent to the first plurality of nanostructures and the second plurality of nanostructures.

13. The depth recognition apparatus of claim 1, wherein the shape distribution of the second plurality of nanostructures is configured to deflect and output the structured light in a particular direction.

14. The depth recognition apparatus of claim 1, wherein the shape distribution of the first plurality of nanostructures and the second plurality of nanostructures is configured such that different transmission phase distributions are dependent on a polarization of incident light.

15. The depth recognition apparatus of claim 1, wherein the path changing member comprises a reflective surface configured to bend the path of the light emitted from the edge emitting device by a particular angle.

16. The depth recognition apparatus of claim 15, wherein the reflective surface comprises a curved surface.

17. The depth recognition apparatus of claim 15,
wherein the reflective surface comprises a meta-surface, the meta-surface comprising an additional plurality of nanostructures each have a dimension smaller than the wavelength of the light emitted from the edge emitting device, and a shape distribution of the additional plurality of nanostructures of the meta-surface is configured to change a divergence angle of light incident thereon.

* * * * *